(12) United States Patent
Madabhushi et al.

(10) Patent No.: US 10,650,515 B2
(45) Date of Patent: May 12, 2020

(54) CHARACTERIZING INTRA-TUMORAL HETEROGENEITY FOR RESPONSE AND OUTCOME PREDICTION USING RADIOMIC SPATIAL TEXTURAL DESCRIPTOR (RADISTAT)

(71) Applicant: Case Western Reserve University, Cleveland, OH (US)

(72) Inventors: Anant Madabhushi, Shaker Heights, OH (US); Satish Viswanath, Pepper Pike, OH (US); Jacob Antunes, Cincinnati, OH (US); Pallavi Tiwari, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 125 days.

(21) Appl. No.: 15/987,137

(22) Filed: May 23, 2018

(65) Prior Publication Data

US 2018/0342058 A1 Nov. 29, 2018

Related U.S. Application Data

(60) Provisional application No. 62/509,987, filed on May 23, 2017.

(51) Int. Cl.
*G06K 9/00* (2006.01)
*G06T 7/00* (2017.01)
(Continued)

(52) U.S. Cl.
CPC .......... *G06T 7/0012* (2013.01); *G01T 1/1611* (2013.01); *G06K 9/3241* (2013.01);
(Continued)

(58) Field of Classification Search
CPC ................................... G01R 33/5608
See application file for complete search history.

(56) References Cited

U.S. PATENT DOCUMENTS

| | | | |
|---|---|---|---|
| 2010/0111396 A1* | 5/2010 | Boucheron | G06K 9/0014 382/133 |
| 2016/0171695 A1* | 6/2016 | Jacobs | A61B 5/055 382/131 |
| 2017/0372117 A1* | 12/2017 | Bredno | G06K 9/0014 |

OTHER PUBLICATIONS

Moradi (NPL "Multiparametric MRI maps for detection and grading of dominate prostate tumors, Jun. 2012 ; 35(6): 1403-1413. doi:10.1002/jmri.23540, pp. 25"). (Year: 2012).*

* cited by examiner

*Primary Examiner* — Oneal R Mistry
(74) *Attorney, Agent, or Firm* — Eschweiler & Potashnik, LLC

(57) ABSTRACT

Embodiments access an image of a region of interest (ROI) demonstrating cancerous pathology; extract radiomic features from the ROI; define a radiomic feature expression scene based on the ROI and radiomic features; generate a cluster map by superpixel clustering the expression scene; generate an expression map by repartitioning the cluster map into expression levels; compute a textural and spatial phenotypes for the expression map based on the expression levels; construct a radiomic spatial textural (RADISTAT) descriptor by concatenating the textural and spatial phenotypes; provide the RADISTAT descriptor to a machine learning classifier; receive, from the machine learning classifier, a first probability that the ROI is a responder or non-responder, or a second probability that the ROI will experience long-term survival or short-term survival, based, at least in part, on the RADISTAT descriptor; and generate a classification of the ROI as a responder or non-responder, or long-term survivor or short-term survivor.

20 Claims, 14 Drawing Sheets

(51) Int. Cl.
  *G06K 9/32* (2006.01)
  *G06K 9/62* (2006.01)
  *G01T 1/161* (2006.01)
  *G01R 33/56* (2006.01)
  *G06N 20/00* (2019.01)
  *G01R 33/563* (2006.01)

(52) U.S. Cl.
  CPC ....... *G06K 9/6218* (2013.01); *G01N 2800/52* (2013.01); *G01N 2800/54* (2013.01); *G01R 33/5601* (2013.01); *G01R 33/5602* (2013.01); *G01R 33/5608* (2013.01); *G01R 33/56341* (2013.01); *G06K 9/6267* (2013.01); *G06K 2209/05* (2013.01); *G06N 20/00* (2019.01); *G06T 2207/10072* (2013.01); *G06T 2207/10088* (2013.01); *G06T 2207/20081* (2013.01); *G06T 2207/20084* (2013.01); *G06T 2207/30096* (2013.01)

CHARACTERIZING INTRA-TUMORAL HETEROGENEITY FOR RESPONSE AND OUTCOME PREDICTION USING RADIOMIC SPATIAL TEXTURAL DESCRIPTOR (RADISTAT)

CROSS REFERENCE TO RELATED APPLICATIONS

This application claims the benefit of U.S. Provisional Application 62/509,987, filed May 23, 2017, which is incorporated herein in its entirety.

FEDERAL FUNDING NOTICE

This invention was made with government support under grants 1U24CA199374-01, R01CA202752-01A1, R01CA208236-01A1, R21CA179327-01, R21CA195152-01, R01DK098503-02, and 1 C06 RR012463-01 awarded by the National Institutes of Health. Also grants W81XWH-13-1-0418, W81XWH-14-1-0323, and W81XWH16-1-0329 awarded by the Department of Defense. The government has certain rights in the invention.

BACKGROUND

Radiomic analysis typically involves extracting a series of quantitative features from a target tissue region of interest (ROI) via radiographic imaging. The target ROI is then described via statistics of the radiomic feature distribution (e.g. mean, skewness, kurtosis), which are then input to a machine learning classifier to make a class label prediction. Radiomics has been employed for prediction of disease aggressiveness and subtype in vivo, as well as characterizing molecular heterogeneity of tumors. However, existing approaches to radiomics-based prediction that employ statistical descriptors may not adequately capture the diversity of radiomic expression present in the target ROI, thus incompletely characterizing the underlying tissue heterogeneity.

Tumor environment heterogeneity on radiographic imaging arises due to the organization of multiple tissue pathologies or sub-compartments. For example, in Glioblastoma multiforme (GBM), the tumor region includes varied tissue types such as edema, necrotic core, and enhancing tumor. Similarly, in rectal cancer (RCa) patients that undergo neoadjuvant chemoradiation therapy, treatment effects such as fibrosis and ulceration are present both within and proximal to the tumor region. As a result of such significant tissue heterogeneity, the resulting radiomic response within and around these tumors appears highly varied, as illustrated in FIG. 1 at, which illustrate representative radiomic heatmaps 110 and 112 in RCa. Thus, existing approaches which utilize conventional statistics such as the mean or skewness value of these feature distributions may not adequately describe the diverse radiomic expression map exhibited by different disease subtypes. Existing approaches may therefore be sub-optimal in predicting outcomes or characterizing response to treatment. Consequently, there is a clinical unmet need for a more comprehensive descriptor of the organization of radiomic expression for disease characterization via radiographic imaging.

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that, in some examples, one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
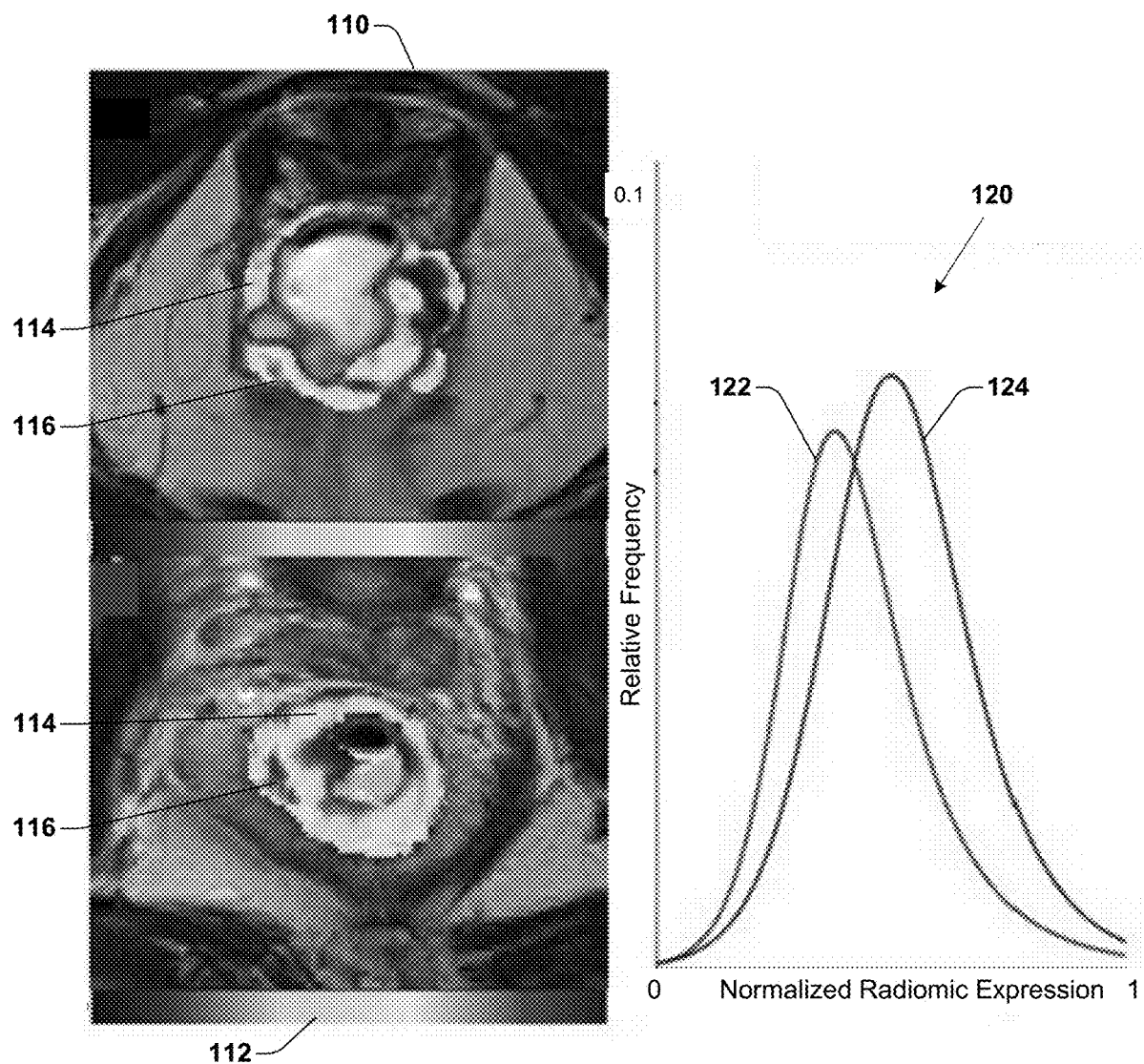
FIG. 1 illustrates representative radiomic feature maps for different RCa patients.

Embodiments described herein distinguish treatment response in patients demonstrating cancerous pathology, including RCa and GBM. Embodiments described herein also predict overall survival in patients demonstrating cancerous pathology, including RCa and GBM. Embodiments define and employ a Radiomic Spatial Textural Descriptor (RADISTAT) that ascribes a common textural and spatial phenotype to a radiomic feature expression map within a target region to characterize tissue heterogeneity. Embodiments characterize radiomic phenotypes for at least two clinically challenging problems: (a) distinguishing favorable from poor treatment response in patients demonstrating cancerous pathology, including RCa, and (b) predicting survival status in patients demonstrating cancerous pathology, including GBM. Embodiments significantly outperform existing statistical approaches for predicting overall survival or treatment response. Embodiments may distinguish treatment response or predict overall survival in patients demonstrating cancerous pathology based on a region of interest (ROI) represented in radiological imagery, including T2-w magnetic resonance imaging (MRI) images, T1-w MRI images, or diffusion-weighted MRI images, including multiple contrast enhanced MRI images.

Radiographic heterogeneity of tumors is often caused by the presence of multiple tissue classes being present within and immediately proximal to the tumor. Multiple tumor classes may include, for example, edema, necrosis, or fibrosis. This radiographic tumor heterogeneity is mirrored in the variable radiomic feature responses, such as regions of over-expression or under-expression, in such tumors. Radiomic analysis within the tumor may involve use of statistical descriptors of the feature distribution (e.g. mean, skewness, or kurtosis), which are then input to a predictive model (e.g. machine learning classifier). However, a single statistic may not fully capture the rich, spatial diversity of radiomic expression within a tissue region. In digital pathology, the spatial architecture of histologic primitives may be predictive of disease outcome. Embodiments described herein capture the spatial arrangement of differential radiomic expression within a target area or ROI and are more predictive of disease outcome than statistics of the radiomic feature distribution employed in existing approaches.

Embodiments described herein employ a RADISTAT descriptor which (a) more completely characterizes the spatial diversity of hot (over-expression) and cold spots (under-expression) exhibited by a radiomic feature, and (b) captures the overall textural appearance of a radiomic feature based on the relative abundance of hot and cold spots. Embodiments may facilitate, for example, (a) discriminating favorable from un-favorable treatment response in RCa patients, and (b) distinguishing short-term from long-term survivors in GBM patients. Embodiments significantly improve classification performance (AUC=0.79 in RCa, AUC=0.75 in GBM) as compared to existing approaches that use simple statistics (e.g., mean, variance, skewness, or kurtosis) to describe radiomic co-occurrence features.

Figure 2:
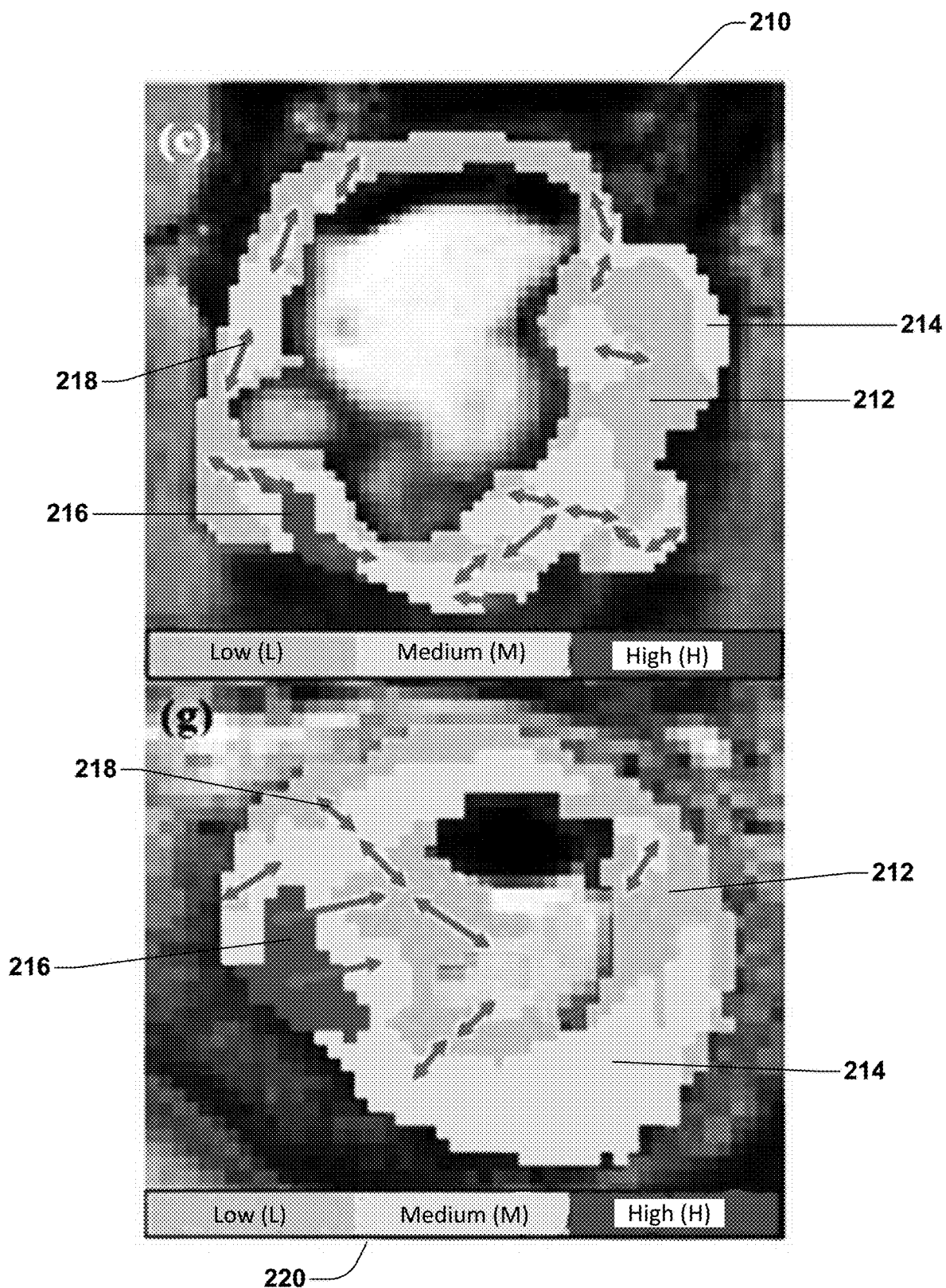
FIG. 2 illustrates cluster maps for different RCa patients.

In digital pathology, spatial statistics and graph-based features for capturing the arrangement of primitives (e.g. glands or nuclei) or sub-compartments (e.g. stroma or epithelium) may be predictive of disease outcome. Embodiments described herein employ the spatial arrangement of hot and cold spots in terms of radiomic expression to facilitate improved disease characterization compared to existing approaches that employ a single first order statistic. In FIG. 2, representative hot sub-compartments 216, cold sub-compartments 212, and medium sub-compartments 214 on radiomic expression maps 210 and 220, based on quantizing the image into 3 expression levels (e.g., hot, medium, low), are illustrated.

Embodiments described herein employ the RADISTAT approach to quantifying spatial arrangement of radiomic feature expression to better describe tissue heterogeneity. Embodiments capture (a) the spatial phenotype of radiomic expression, i.e. how sub-compartments of low and high radiomic expression are spatially located relative to one another within the ROI, and (b) the textural phenotype associated with radiomic expression, i.e. whether an ROI exhibits a predominance of low or high expression sub-compartments. Embodiments provide improved utility and performance compared to existing approaches in the context of at least two problems. First, embodiments provide improved evaluation of response to chemoradiation in RCa, by distinguishing favorable response (no metastatic nodes or distant metastasis present after treatment) from poor response, via post-treatment MRI. Second, embodiments provide improved differentiation of long-term from short-term survivors with GBM, using treatment-naive MRIs. Embodiments may be employed to predict treatment response or overall survival time in patients demonstrating other, different cancerous pathologies.

Some existing approaches to analyzing GBM look at separate tumor sub-compartments, albeit using volumetric or radiomic histogram analysis alone. Similarly, sub-compartment-based radiomic analysis of breast MRI and lung fluorodesoxyglucose (FDG) positron emission tomography (PET)/CT has been employed for predicting patient response to treatment as well as patient survival. In one existing approach, a Gaussian mixture model of multi-parametric MRI intensities is employed to define sub-compartments in GBMs. Spatial point pattern analysis is then used to perform a neighborhood analysis of these sub-compartments.

In contrast to such existing approaches, embodiments described herein that employ RADISTAT generate a more detailed radiomic characterization of tissue heterogeneity, compared to existing approaches that use MR intensities alone. In contrast to existing approaches, embodiments described herein leverage computer-extracted radiomic expression maps to generate intra-tumoral clusters, rather than using MRI intensities prior to any analysis of the sub-compartment distributions. Embodiments generate a spatial characterization of radiomic expression and proportion of different expression levels. Embodiments define sub-compartments on the radiomic feature expression map through a 2-stage process: (1) superpixel clustering of the radiomic feature to identify spatially similar regions, and (2) re-partitioning the superpixel map to define sub-compartments based to a desired number of expression levels (e.g. over-expression (hot), medium expression (warm), and under-expression (cold), when considering 3 expression levels). Finally, embodiments employing RADISTAT compute at least two distinct features: (1) the overall spatial arrangement of different sub-compartments with respect to one another, and (2) the overall proportions of different expression levels for the radiomic feature.

Figure 4:
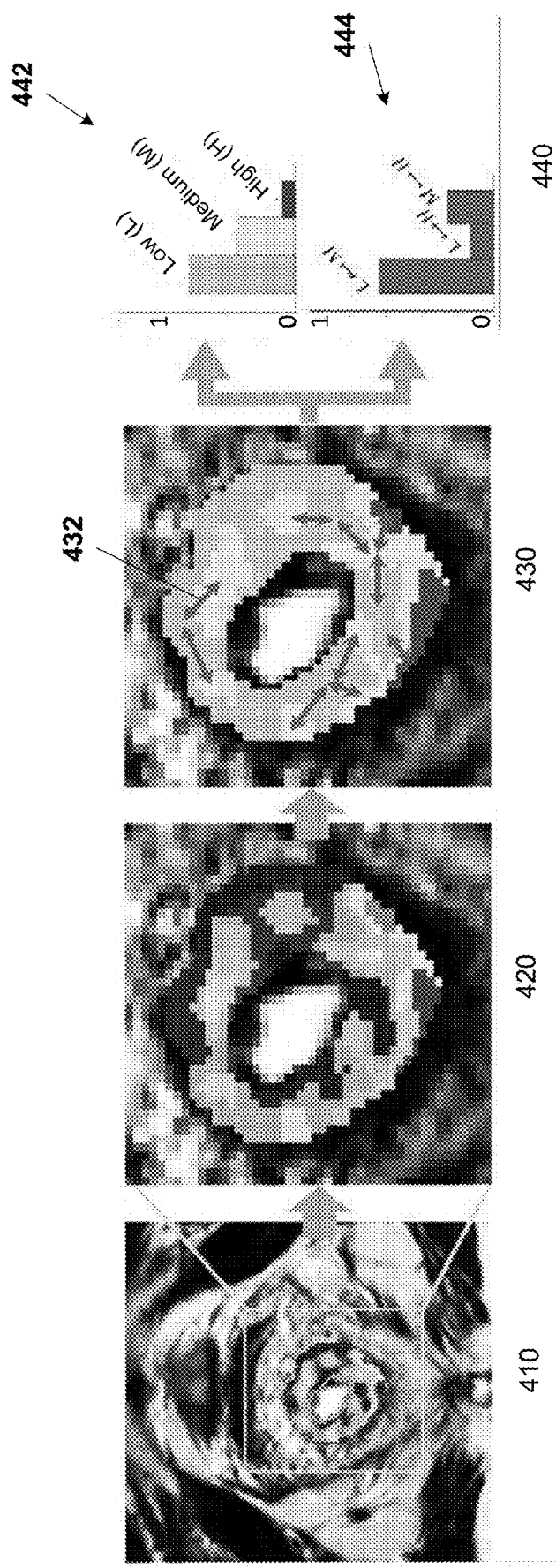
FIG. 4 is a schematic overview of an exemplary workflow for obtaining a radiomic spatial textural descriptor.

FIG. 4 illustrates one exemplary approach for computation of the RADISTAT descriptor. A heatmap 410 of an input radiomic scene I is accessed. At 420, super-pixel clustering is applied to yield a cluster map $\hat{I}$ (grey scale represents dominant clusters). At 430, by re-partitioning cluster map $\hat{I}$ into B=3 expression levels, the expression map $\tilde{I}$ is obtained, where each of the three grey levels in this example represents a different expression level. Phenotypes are computed at 440. In this example, a textural phenotype $\tau$ is computed as the proportion of each of the low (L), medium (M), and high (H) expression levels in $\tilde{I}$ illustrated in the top bar plot 442. At the bottom bar plot 444, a spatial phenotype $\varsigma$ is computed as the number of times L-M, M-H, and L-H expression levels are adjacent to each other, based on the adjacency graph depicted by the arrows 432 on $\tilde{I}$. The RADISTAT descriptor is then obtained as the concatenation of $\tau$ and $\varsigma$.

The approach illustrated in FIG. 4 is now described in more detail. In one embodiment, a radiomic feature expression scene is denoted I=(C; f) at 410. In this embodiment, C is a spatial grid of pixels c, in $\mathbb{R}^2$ or $\mathbb{R}^3$. In this embodiment, every pixel, c∈C, is associated with a radiomic feature value f(c). In another embodiment, less than every pixel is associated with a radiomic feature value. For example, some pixels may be associated with imaging artifacts, outliers, or other imperfections in the image and thus may not have an associated radiomic feature value, or may be excluded from the radiomic feature expression scene I. The range of I is normalized to lie between 0 and 1.

At 420, superpixel clustering of the radiomic feature maps is performed. Superpixel clustering of I is performed using a modified version of the simple linear iterative clustering (SLIC) algorithm, to generate K clusters, $\hat{C}_k \subset C, k \in \{1, \ldots, K\}$. Note that in the modified SLIC approach described herein, K is implicitly defined based on 2 parameters: (1) the minimum number of pixels in a cluster ($\alpha$), and (2) the number of pixels between initial cluster seeds ($\beta$). Thus for each combination of $\alpha$ and $\beta$, different clusterings of I will be obtained. Based on superpixel clustering, I is quantized to obtain a cluster map $\hat{I}=(C,g)$, where for every $c \in \hat{C}_k \subset C$, g(c) is the average radiomic feature value within the cluster $\hat{C}_k$. Note that I is normalized such that min (g(c))=0 and max(g(c))=1.

At 430, the superpixel clusters are re-partitioned into expression levels. Firstly, a user-defined parameter B, which captures the desired number of expression levels, is identified. The choice of B dictates how fine a variation in radiomic feature values is captured by RADISTAT. Using this input parameter B, the range of $\hat{I}$ is split into B equally spaced bins, yielding B+1 thresholds $\theta_j, j \in \{0, \ldots, B\}$. Based on the normalized range of $\hat{I}$, $\theta_0=0$ and $\theta_B=1$. These $\theta_j, j \in \{0, \ldots, B\}$, are used to re-quantize $\hat{I}$ into an expression map, $\tilde{I}$ I=(C,h), where $\forall c \in C$, $h(c)=\theta_j$, if $\theta_{j-1} < g(c) \leq \theta_j$. As $\tilde{I}$ only has B unique values, any adjacent clusters which exhibit the same expression value are merged to yield M distinct partitions. A partition is defined as $\tilde{C}_m = \{c | h(c) = \theta_j\}$, where $m \in \{1, \ldots, M\}$ and $\tilde{C}_m = C$. For ease of notation, we also define the expression value of a partition $\tilde{C}_m$ as $H(\tilde{C}_m)=\theta_j$, if $\forall c \in \tilde{C}_m$, $h(c)=\theta_j$.

For example, when B=3 (corresponding to low, medium, and high expression), the thresholds $\theta_j = \{0, 0.33, 0.67, 1\}$. The resulting expression map $\tilde{I}$ will only have three unique values, $\{0.33, 0.67, 1\}$ but can have M distinct partitions, as multiple partitions $\tilde{C}_m$ can have the same expression value.

At 440, phenotypes are computed. The textural phenotype is computed at 442, and the spatial phenotype is computed at 444. The textural phenotype is obtained by quantifying the fraction of each of B expression levels in $\tilde{I}$. For B=3, this means calculating what fraction of expression map $\tilde{I}$ exhibits low, medium, or high expression. For each expression level $\theta_j$ and $\forall j = \{1 \ldots, B\}$, $$\tau_j = \frac{|c \mid h(c) = \theta_j|}{|C|} \quad \text{(Eq. 1)}$$

The resulting feature vector is a 1×B vector $\tau = [\tau_1, \ldots, \tau_B]$.

The spatial phenotype is obtained by quantifying the adjacency for each pairwise combination of B expression levels in $\tilde{I}$. Considering the case of low (L), medium (M), and high (H) expression (i.e. B=3), there are three pairwise combinations: L-M, L-H, M-H. The adjacency of L-M is obtained by counting number of times that $\tilde{I}$ has partitions with low and medium expression adjacent to each other. The adjacency of L-H is obtained by counting number of times that $\tilde{I}$ has partitions with low and high expression adjacent to each other. The adjacency of M-H is obtained by counting number of times that $\tilde{I}$ has partitions with medium and high expression adjacent to each other. Other adjacencies for other values of B may be similarly computed.

For this embodiment, an adjacency graph G=(V E) is defined, where $V = \{v_m\}, m \in \{1, \ldots, M\}$, comprises the centroids of each of M partitions obtained at 420; and $E = \{e_{mn}\}, m, n \in \{1, \ldots, M\}$ is a set of edges. An edge in E is defined when, $$e_{mn} = \begin{cases} 1, & \text{if } \tilde{C}_m \text{ adjacent to } \tilde{C}_n, m \neq n \\ 0, & \text{otherwise} \end{cases} \quad \text{(Eq. 2)}$$

For every pair of expression levels $\theta_i$ and $\theta_j$, $i, j \in \{1, \ldots, B\}$ the adjacency is calculated as:

$$\varsigma_{mn} = \Sigma e_{mn}, \text{ where } H(\tilde{C}_m) = \theta_i \text{ and } H(\tilde{C}_n) = \theta_j. \quad \text{(Eq. 3)}$$

The resulting feature vector is a 1×N vector $\varsigma = [\varsigma_1, \ldots, \varsigma_N]$, where $$N = \binom{B}{2}$$

is the total number of expression level pairs in $\tilde{I}$. The RADISTAT descriptor is constructed by concatenating $\tau$ and $\varsigma$ to yield a 1×(B+N) vector.

In summary, FIG. 4 illustrates the workflow of RADISTAT as employed by embodiments described herein, and its implementation in the context of clinical problems in RCa and GBM. In one embodiment, for each dataset considered, a representative two dimensional (2D) section was obtained from the middle of isotropically resampled volumes, and the region of interest was annotated by an expert radiologist. Twelve gray level co-occurrence matrix (GLCM) features were extracted on a pixel-wise basis from every 2D section, in both datasets. These GLCM features were entropy, energy, inertia, correlation, information measures 1 and 2, sum and difference averages, variances, and entropies. Embodiments employing RADISTAT were compared against 4 statistical descriptors (mean, variance, skewness, and kurtosis of the radiomic expression distribution), $\tau$, and $\varsigma$, for all twelve features. Performance of embodiments employing RADISTAT with a linear discriminant analysis (LDA) classifier in order to differentiate the two patient groups in each cohort was evaluated. A 3-fold cross-validation strategy was employed and the performance of each of the radiomic descriptors was compared over different superpixel parameters, $\alpha \in \{5, 10, 15, 20\}$ and $\beta \in \{3, 5, 7\}$, where $\alpha$ and $\beta$ are values in pixels. In this example, the number of bins was fixed at B=3, corresponding to high, medium, and low radiomic expression levels. $\alpha=5$ and $\beta=7$ were empirically found to be optimal parameters across all twelve GLCM features and were employed for further evaluation. Classifier accuracy was measured as area under the receiver-operative curve (AUC), with average AUC values over 25 runs of 3-fold cross validation for both the cohorts. Kruskal-Wallis multiple comparison testing was performed to determine statistical significance, based on adjusted p-values via the Bonferroni correction.

Embodiments described herein may be employed to predict overall survival or distinguish treatment response in patients demonstrating cancerous pathology. For example, one embodiment may predict overall survival time for a patient demonstrating GBM, while another embodiment may distinguish treatment response for a patient demonstrating RCa. Another embodiment may predict or distinguish treatment response and predict overall survival for a patient demonstrating cancerous pathology including GBM, RCa, prostate cancer, lung cancer, breast cancer, or other type of cancerous pathology.

Embodiments may compute the RADISTAT descriptor in two dimensions or in three dimensions. For example, one embodiment that computes the RADISTAT descriptor in two or three dimensions accepts as data the radiomic feature expression scene I=(C, f). A user inputs a desired number of expression levels B. In this embodiment, K clusters in C are generated such that $\hat{C}_k \subset C$, $k \in \{1, \ldots, K\}$ using the modified SLIC approach. Then, for each cluster $k \in K$, the embodiment computes $$\mu_k = \frac{\sum_d f(d)}{|\hat{C}_k|}$$

where $d \in \hat{C}_k$; and where $g(d)=\mu_k$, $\forall d \in \tilde{C}_k$. Then, for each pixel $c \in C$, embodiments compute $h(c)=\theta_j$, if $\theta_{j-1} < g(c) < \theta_j$, where $j \in \{0, \ldots, B\}$. Adjacent clusters that exhibit the same expression values are merged. A textural phenotype expressed as a 1×B vector τ is obtained as described with respect to Equation 1 above. A spatial phenotype expressed as a 1×N vector ς is obtained as described with respect to Equation 3 above. The RADISTAT descriptor may then be constructed from τ and ς.

Figure 3:
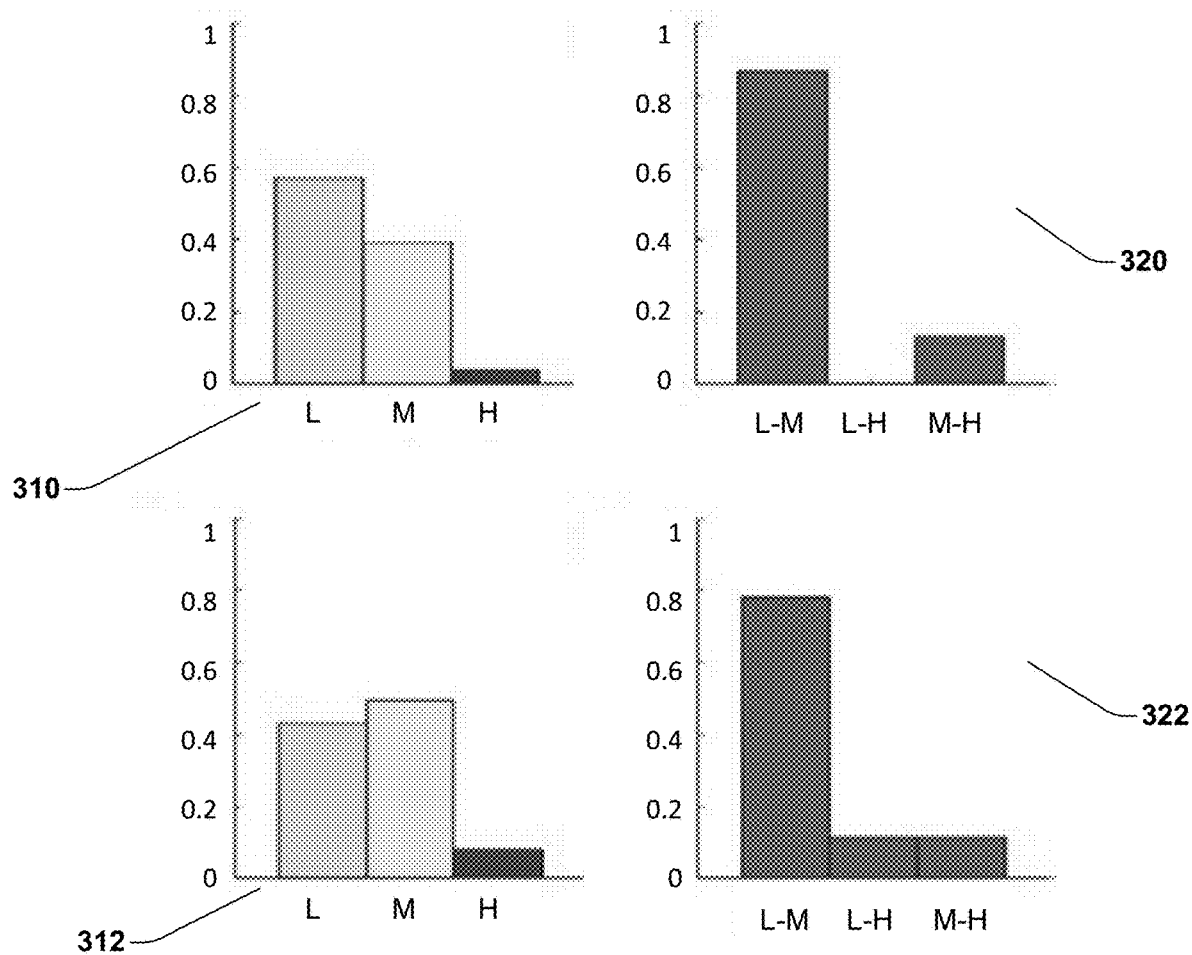
FIG. 3 illustrates textural and spatial phenotypes between different RCa patients.

Returning to FIG. 1, heatmaps 110 and 112 of representative low and high clinically staged patients for RCa following chemotherapy treatment are illustrated. The heatmaps 110 and 112 depict the radiomic feature representation of a single GLCM descriptor, correlation, for each pixel. In this example, higher values of correlation are indicated at 116, while lower values of correlation are indicated at 114. In another example, different values of correlation may be expressed in different formats, for example, color based heatmaps, or other graphical representations. Distributions of the radiomic feature expression between the two patients are expressed in graph 120. Distribution of unfavorable response is illustrated by curve 122, and distribution of favorable response is illustrated by curve 124. Existing approaches would indicate minimal separation in the distribution curves 122 and 124 of the radiomic expression between the two pathologic responses illustrated in graph 120. Embodiments re-quantize the radiomic heatmaps 110 and 112 through superpixel clustering and partitioning as illustrated in FIG. 2 at 210 and 220 respectively, revealing underlying differences in the frequency of binned expression levels that existing approaches ignore or are unable to capture. The underlying difference in the frequency of binned expression levels is illustrated in FIG. 3, for the textural phenotype τ, by bar graphs 310 and 312, and for spatial arrangement of the expression clusters, ς, by bar graphs 320 and 322. The vectors 218 overlaid on the partitioned radiomic expression level maps 210 and 220 indicate the presence of an adjacent edge between two different expression level clusters. Note that the region of interest acquired from the patient with favorable response illustrated in 210 has a higher proportion of medium to high expression and more graph connections with high expression clusters than that of the patient with poor response illustrated in 220. This reflects the presence of more spatially distinct treatment-related effects within the tumor region in patients with favorable response.

Figure 5:
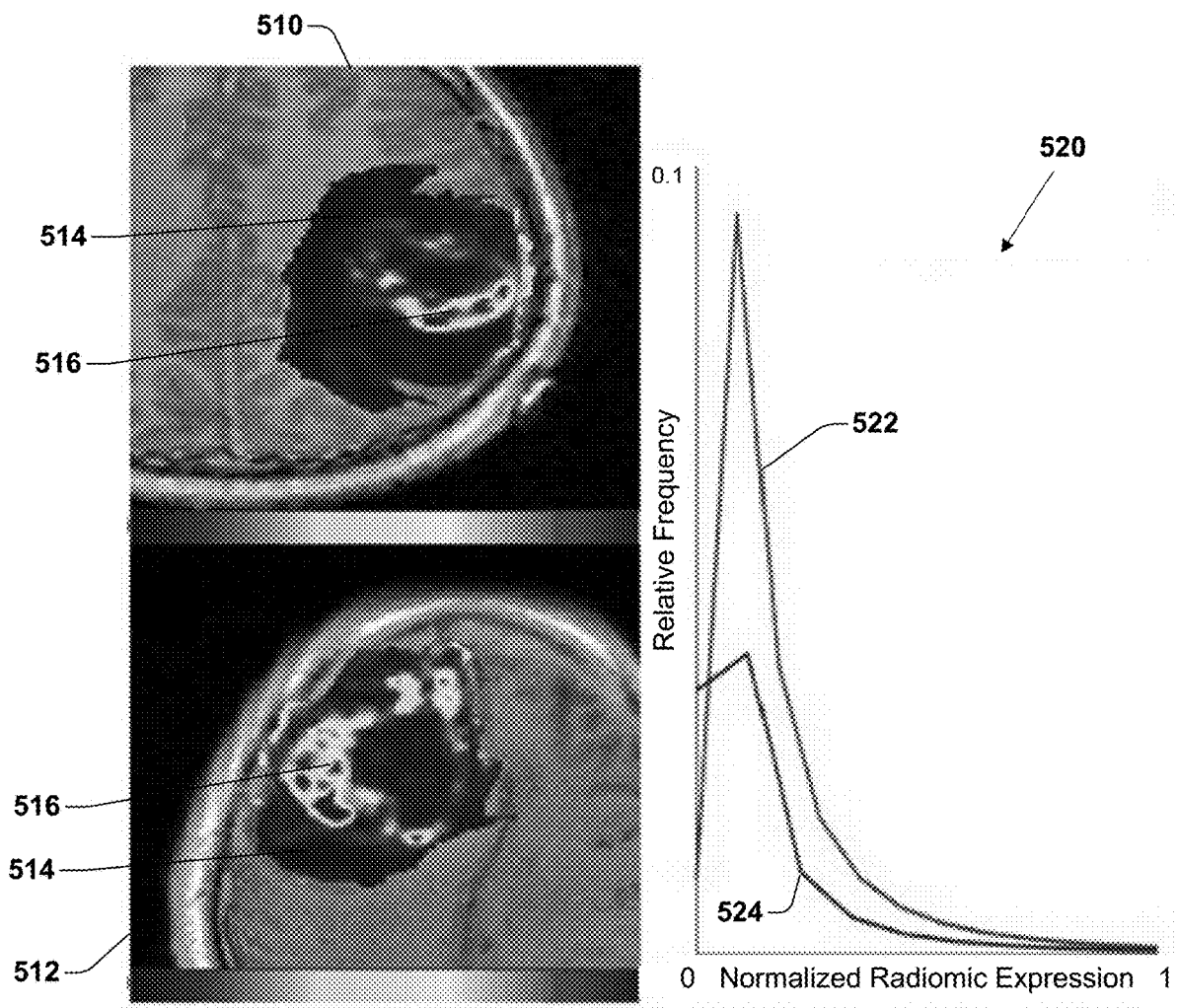
FIG. 5 illustrates representative radiomic feature maps for different GBM patients.
Figure 6:
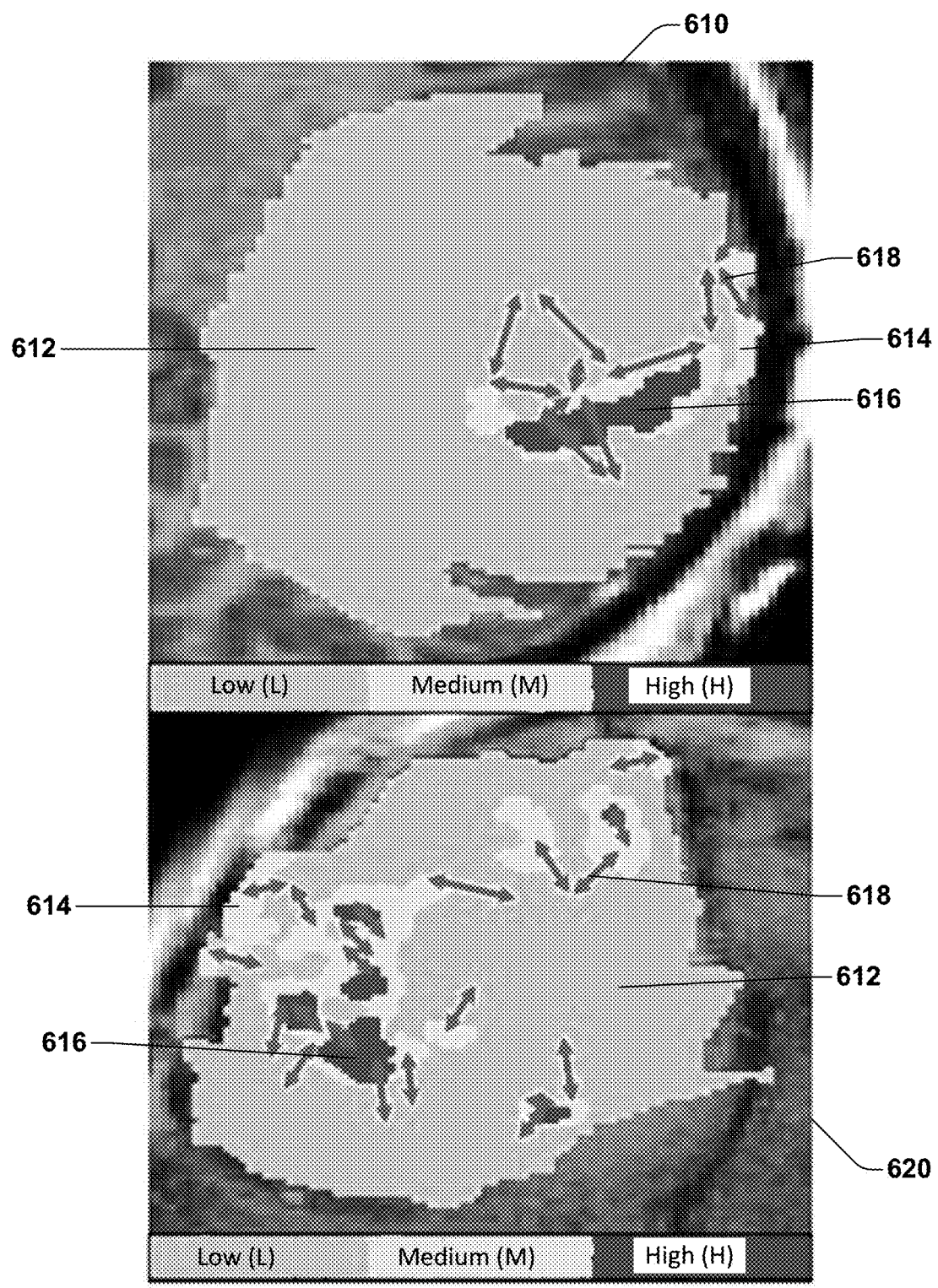
FIG. 6 illustrates cluster maps for different GBM patients.

FIG. 5 illustrates radiomic feature heatmaps 510 and 512 of representative GBM patients with long-term survival (heatmap 510) or short term survival (heatmap 512). Areas of high feature representation are illustrated at 516, and areas of low feature representation are illustrated at 514. The feature distributions in graph 520 show significant overlap between the distribution of short term survival curve 522 and long-term survival curve 524. In FIG. 6, the radiomic feature illustrated in heatmaps 510 and 512 is partitioned into three (e.g., B=3) expression values and displayed as high (H) expression value region 616, medium (M) expression value region 614, and low (L) expression value region 612 illustrated in expression maps 610 and 620. The vectors 618 overlaid on the partitioned radiomic expression maps 610 and 620 indicate the presence of an adjacent edge between two different expression level clusters.

Figure 7:
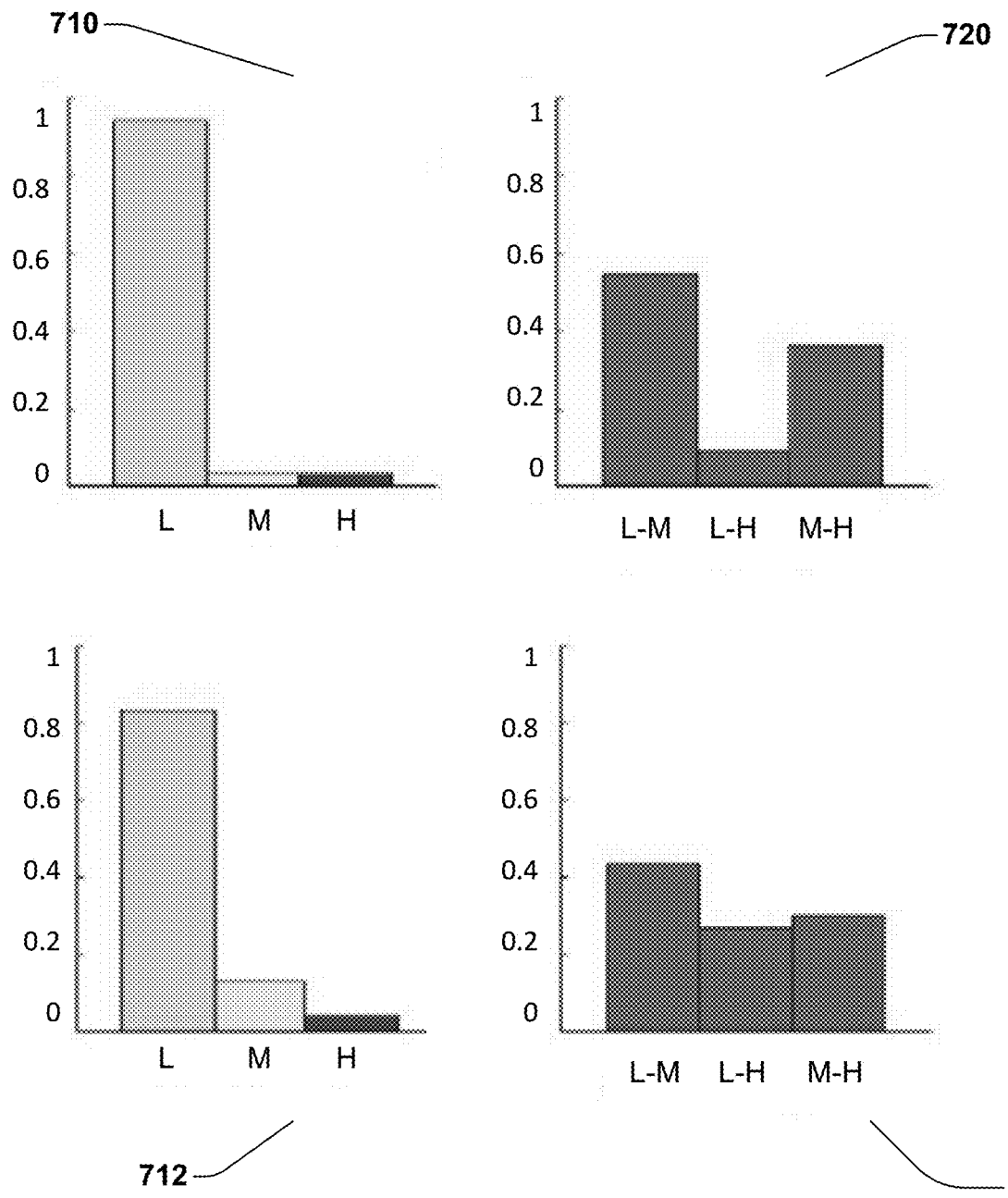
FIG. 7 illustrates textural and spatial phenotypes between different GBM patients.

FIG. 7 illustrates histograms 710, 712, 720, and 722 of the proportion of expression levels and adjacent connections between different expression levels which reveal underlying differences in the textural phenotype (histograms 710 and 712), and spatial phenotype (histograms 720 and 722), between the two prognostic outcomes respectively. In this example, radiomic heatmaps 510 and 512, and expression maps 610 and 620, are for the GLCM feature inertia, which is a measure of contrast within a neighborhood of pixels. The most prominent difference between these two prognostic outcomes appears in the τ and ς descriptors which indicate greater proportions of medium and high frequency expression clusters and adjacent L-H expression level connections. The results indicate that more aggressive GBM cases (with poor overall survival) have an imaging phenotype with more pronounced "hot spots", which is not captured by the radiomic expression distributions graph 520.

Figure 8:
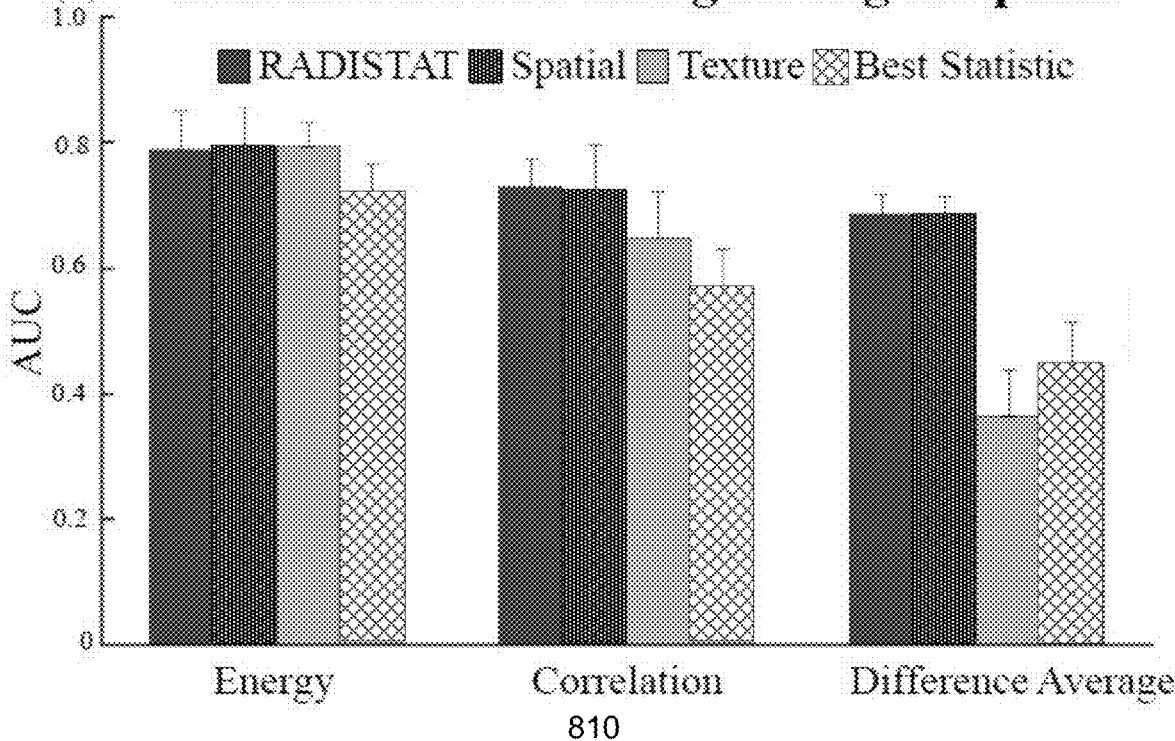
FIG. 8 illustrates graphs comparing performance in distinguishing response to treatment or predicting survival time in RCa or GBM patients.
Figure 8:
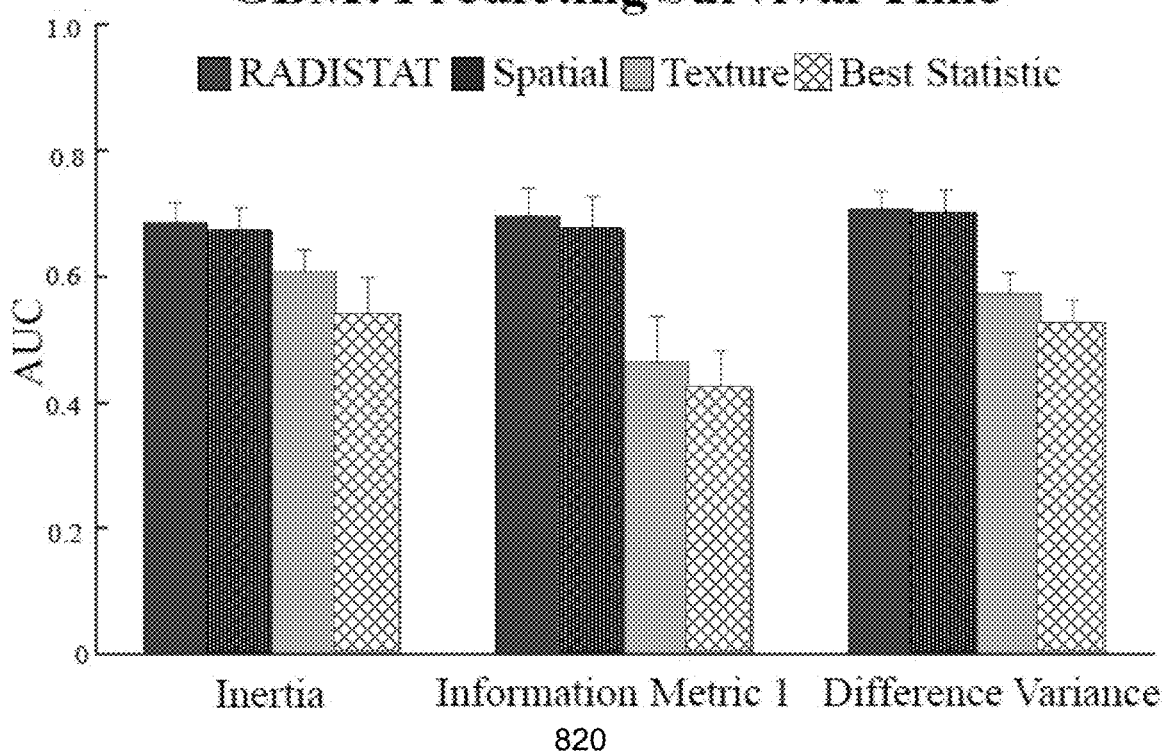

FIG. 8 illustrates graphs 810 and 820 that demonstrate that RADISTAT quantitatively outperforms the best statistic and texture (τ) for the highest performing GLCM features including Inertia ($p<0.001$), Information Metric 1 ($p<0.001$), and Difference Variance ($p<0.001$). Graphs 810 and 820 further demonstrate that RADISTAT achieves higher AUCs than spatial (ς) alone. FIG. 8 illustrates average AUCs across 25 runs of 3-fold cross validation for the RCa dataset illustrated in graph 810, and for the GBM dataset illustrated in graph 820, for the top three GLCM features in each category. Embodiments described herein employing RADISTAT result in a consistently higher performance than any compared strategies, including the best performing statistical descriptor, the individual textural, or the individual spatial components of RADISTAT. The quantitative results illustrated in FIG. 8 demonstrate that RADISTAT significantly outperforms top-ranked statistics for the three highest performing GLCM features including energy, correlation, and difference average ($p<0.001$ for each).

Embodiments described herein distinguish treatment response or predict overall survival in patients demonstrating cancerous pathology with greater accuracy than existing approaches that may only use a single statistic input to a predictive model. Embodiments more completely characterize the spatial diversity of over-expression and under-expression exhibited by a radiomic feature, and further capture the overall textural appearance of a radiomic feature based on the relative abundance of over-expression and under-expression, thus providing greater discrimination between classes than existing approaches. By increasing the accuracy with which treatment response or overall survival in patients demonstrating cancerous pathology is predicted, example methods and apparatus produce the concrete, real-world technical effect of increasing the probability that at-risk patients receive timely treatment tailored to the particular pathology they exhibit. The additional technical effect of reducing the expenditure of resources and time on patients who have a less aggressive pathology is also achieved. Example embodiments further improve on existing approaches by providing a more accurate second reader to facilitate the reduction of inter-reader and intra-reader variability among human radiologists, pathologists, or oncologists. Example methods and apparatus thus improve on existing methods in a measurable, clinically significant way. When implemented as part of a personalized medicine system, a computer assisted diagnostic (CADx) system, a treatment response distinguishing system or an overall survival prediction system, which may include a computer or a processor configured to predict treatment response or overall survival in patients demonstrating cancerous pathology, example embodiments improve the performance of a machine, computer, or computer-related technology by providing a more accurate and more reliable prediction of treatment response or overall survival compared to existing approaches to controlling a machine to predict treatment response or overall survival.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, circuit, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 9:
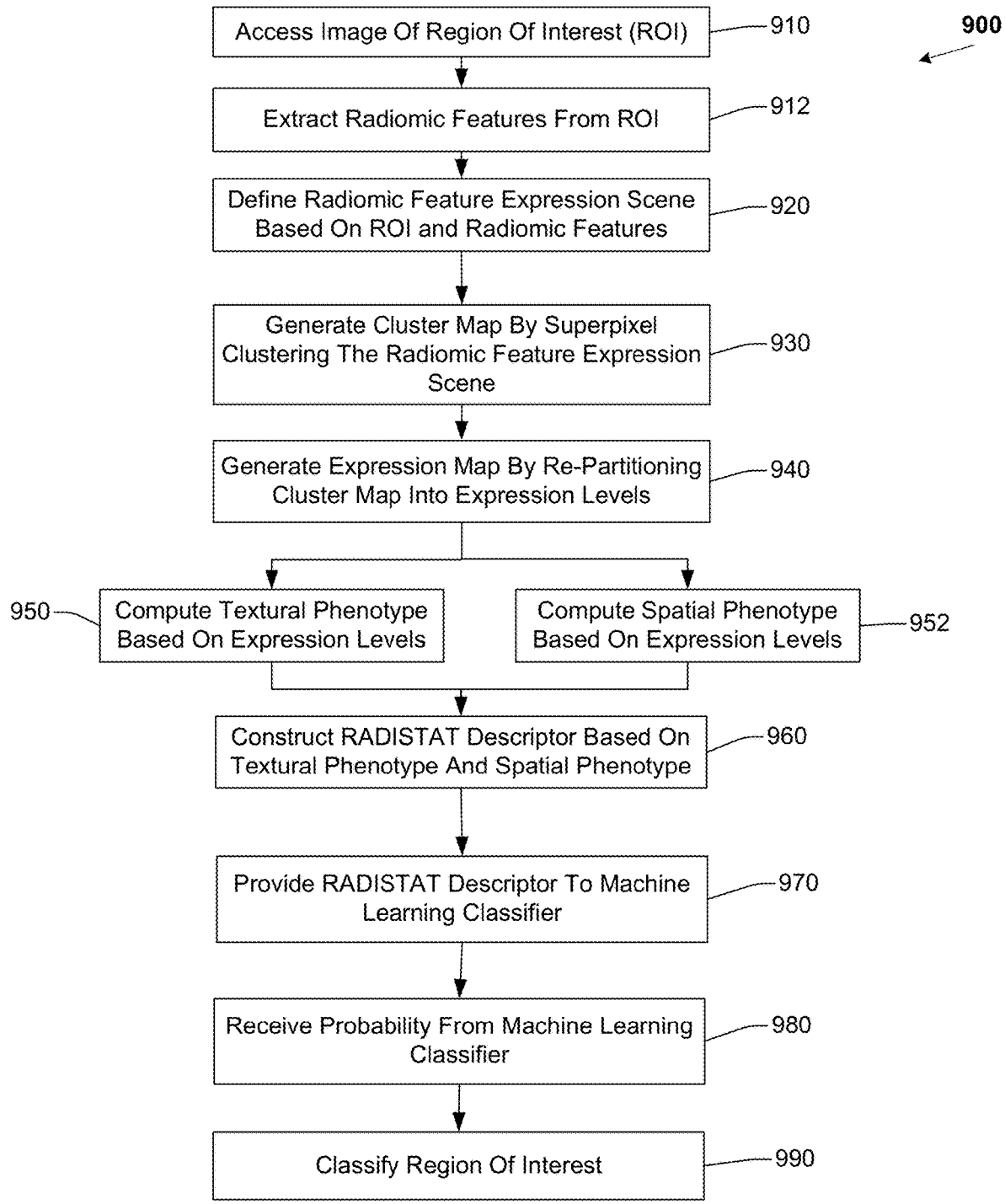
FIG. 9 is a flow diagram of example operations for classifying a region of interest as a responder or non-responder, or as a long-term survivor or short-term survivor.

FIG. 9 is a flow diagram of an example set of operations 900 that may be performed by a processor for predicting treatment response or overall survival in patients demonstrating cancerous pathology, including RCa or GBM. A processor(s) may include any combination of general-purpose processors and dedicated processors (e.g., graphics processors, application processors, etc.). The processors may be coupled with or may include memory or storage and may be configured to execute instructions stored in the memory or storage to enable various apparatus, applications, or operating systems to perform the operations. The memory or storage devices may include main memory, disk storage, or any suitable combination thereof. The memory or storage devices may include, but are not limited to any type of volatile or non-volatile memory such as dynamic random access memory (DRAM), static random-access memory (SRAM), erasable programmable read-only memory (EPROM), electrically erasable programmable read-only memory (EEPROM), Flash memory, or solid-state storage.

The set of operations 900 includes, at 910, accessing a set of images of a region of tissue demonstrating cancerous pathology. A member of the set of images includes a target tissue region of interest (ROI). Accessing the set of images includes acquiring electronic data, reading from a computer file, receiving a computer file, reading from a computer memory, or other computerized activity. A member of the set of images has a plurality of pixels, a pixel having an intensity. In one embodiment, a member of the set of images is a 3 Tesla T2-w magnetic resonance imaging (MRI) image of a region of tissue demonstrating rectal cancer (RCa), or a gadolinium-contrast (GD-C) T1-w MRI image of a region of tissue demonstrating Glioblastoma multiforme (GBM).

In one embodiment, at 910, a member of the set of images demonstrating GBM is pre-processed by subjecting the member of the set of images to bias field correction, skull-stripping, and intensity standardization. In another embodiment, a member of the set of images is of a different region of tissue demonstrating a different form of cancerous pathology. In another embodiment, a member of the set of images is acquired using a different imaging technique, including computed tomography, or other type of imaging technique.

The set of operations 900 also includes, at 912, extracting a set of radiomic features from the ROI. A radiomic feature has a value. The value may be based, at least in part, on a pixel intensity. In one embodiment, the set of radiomic features includes at least one gray level co-occurrence matrix (GLCM) feature. The at least one GLCM feature may be an entropy feature, an energy feature, an inertia feature, a correlation feature, an information measure 1 feature, an information measure 2 feature, a sum average feature, a sum variance feature, a sum entropy feature, a difference average feature, a difference variance feature, or a difference entropy feature. In one embodiment, the set of radiomic features are extracted using a window size of three pixels in both 2D and 3D. Using a window with, in this example, a size of three pixels, facilitates deriving the intensity co-occurrences in all spatial directions. In another embodiment, the set of radiomic features may include other types of radiomic feature, including, for example, a Gabor feature, a co-occurrence of local anisotropic gradient tensors feature, a Laws feature, or other radiomic feature. The set of radiomic features includes sub-visual features that cannot be perceived by the human eye or extracted by pencil and paper. In one embodiment, the set of radiomic features is extracted on a pixel-wise basis. For example, for each pixel in the ROI, a radiomic feature having a value may be extracted. In another example, for less than each pixel in the ROI, a radiomic feature having a value may be extracted.

The set of operations 900 also includes, at 920, defining a radiomic feature expression scene based on the ROI and the set of radiomic features. In one embodiment, the radiomic feature expression scene includes a spatial grid of pixels. A pixel in the grid of pixels is associated with a radiomic feature value. In one embodiment, the set of operations further includes normalizing the radiomic feature expression scene. Normalizing the radiomic feature expression scene may include normalizing the radiomic feature expression scene from 0 to 1.

The set of operations 900 also includes, at 930, generating a cluster map by superpixel clustering the radiomic feature expression scene. Generating the cluster map by superpixel clustering the radiomic feature expression scene includes using a modified simple linear iterative clustering (SLIC) approach to generate K clusters. In this embodiment, K is based on a minimum number of pixels in a cluster, and a distance between initial cluster seeds. K is an integer. In one embodiment, K is defined based on the minimum number of pixels in a cluster and the distance between initial cluster seeds. In one embodiment, the minimum number of pixels in a cluster is 7, and the distance between initial cluster seeds is 5. In one embodiment, the cluster map is normalized such that an average radiomic feature value within a cluster has a minimum of 0 or a maximum of 1. In another embodiment, other parameters or techniques may be employed to superpixel cluster the radiomic feature expression scene. For example, in one embodiment, $\alpha=5$ and $\beta=5$ may be employed when distinguishing responders from non-responders in RCa in two dimensions, where a and p are values in pixels representing the minimum number of pixels in a cluster and the distance between initial cluster seeds respectively. In one embodiment, $\alpha=50$ and $\beta=7$ may be employed when distinguishing responders from non-responders in RCa in three dimensions. In another embodiment, $\alpha=20$ and $\beta=5$ may be employed when predicting overall survival in GBM in two dimensions. In another embodiment, $\alpha=100$ and $\beta=9$ may be employed when predicting overall survival in GBM in three dimensions.

The set of operations 900 also includes, at 940, generating an expression map by repartitioning the cluster map into B expression levels, where B is an integer. In one embodiment, B equals three. In another embodiment, B may have another, different value. B may be user-selectable.

The set of operations 900 also includes, at 950, computing a textural phenotype for the expression map based on the B expression levels. Computing the textural phenotype includes quantifying the fraction of each of B expression levels in the expression map. In one embodiment, computing the textural phenotype includes quantifying the fraction of a threshold number of B expression levels in the expression map. In one embodiment, the textural phenotype is a 1×B feature vector.

The set of operations 900 also includes, at 952, computing a spatial phenotype for the expression map based on the B expression levels. Computing the spatial phenotype includes quantifying the adjacency for each pairwise combination of B expression levels in the expression map. In one embodiment, computing the spatial phenotype includes quantifying the adjacency for a threshold number of pairwise combination of B expression levels in the expression map. In one embodiment, the spatial phenotype is a 1×N feature vector, where $$N = \binom{B}{2}$$

is the total number of expression level pairs in the expression map.

The set of operations 900 also includes, at 960, constructing a radiomic spatial textural (RADISTAT) descriptor by combining the textural phenotype with the spatial phenotype. In one embodiment, the RADISTAT descriptor is constructed by concatenating the textural phenotype with the spatial phenotype to yield a 1×(B+N) vector. In another embodiment, the RADISTAT descriptor is constructed based on a weighted combination of the textural phenotype and the spatial phenotype. In another embodiment, the RADISTAT descriptor is constructed based on a matrix multiplication of the textural phenotype and the spatial phenotype. In another embodiment, the RADISTAT descriptor is constructed by other combinations of the textural phenotype and the spatial phenotype.

The set of operations 900 also includes, at 970, providing the RADISTAT descriptor to a machine learning classifier. Providing the RADISTAT descriptor to a machine learning classifier includes acquiring electronic data, reading from a computer file, receiving a computer file, reading from a computer memory, or other computerized activity. In one embodiment, the machine learning classifier is a linear discriminant analysis (LDA) classifier. In another embodiment, the machine learning classifier may be a, random forest classifier, a support vector machine (SVM) classifier, a convolutional neural network (CNN) classifier, or other type of machine learning or deep learning classifier.

The set of operations 900 also includes, at 980, receiving, from the machine learning classifier, a first probability that the ROI is a responder or non-responder, or a second probability that the ROI will experience long-term survival or short-term survival, where the machine learning classifier computes the first probability or the second probability based, at least in part, on the RADISTAT descriptor. Receiving the first probability or the second probability from the machine learning classifier includes acquiring electronic data, reading from a computer file, receiving a computer file, reading from a computer memory, or other computerized activity.

The set of operations 900 also includes, at 990, generating a classification of the ROI as a responder or non-responder, or as a long-term survivor or short-term survivor based on the first probability or the second probability, respectively. For example, in one embodiment, the region of tissue may be classified as a responder if the machine learning classifier provides a first probability greater than 0.5, while the region of tissue may be classified as a non-responder if the first probability is less than or equal to 0.5. In another embodiment, the region of tissue may be classified as a responder if the first probability has another, different value, for example 0.6, 0.75, or 0.9. In one embodiment, the classification may be based on the first probability and at least one of the set of images, or the RADISTAT descriptor. In another embodiment, the region of tissue may be classified as a long-term survivor if the machine learning classifier provides a second probability greater than 0.5, while the region of tissue may be classified as a short-term survivor if the second probability is less than or equal to 0.5. In another embodiment, the region of tissue may be classified as a long-term survivor if the second probability has another, different value, for example 0.6, 0.75, or 0.9. In embodiments described herein, short-term survival is defined as an overall survival (OS) time of less than or equal to seven months, and long term survival is defined as an OS greater than or equal to sixteen months. In other embodiments, other OS values may be employed. In one embodiment, the classification may be based on the second probability and at least one of the set of images, or the RADISTAT descriptor.

In one embodiment, the operations 900 further include training the machine learning classifier. In this embodiment, the machine learning classifier is trained and tested using a training set of images and a testing set of images. Training the machine learning classifier may include training the machine learning classifier until a threshold level of accuracy is achieved, until a threshold time has been spent training the machine learning classifier, until a threshold amount of computational resources have been expended training the machine learning classifier, or until a user terminates training. Other training termination conditions may be employed. Training the machine learning classifier may also include determining which radiomic features and associated RADISTAT descriptor are most discriminative in distinguishing responders from non-responders, or predicting overall survival.

In one embodiment, a member of the set of images is acquired using contrast enhanced MRI. In this embodiment, the set of radiomic features describes the organization of contrast uptake on MRI. The modified SLIC algorithm is applied to cluster the pixels into sub-compartments based on their contrast uptake profiles. Adjacent clusters are then merged based on similarity in average uptake profiles. A textural phenotype expressed as a 1×B vector T is obtained as described with respect to Equation 1 above. A spatial phenotype expressed as a 1×N vector f is obtained as $\varsigma$ described with respect to Equation 3 above. The RADISTAT descriptor may then be constructed from $\tau$ and $\varsigma$.

Figure 10:
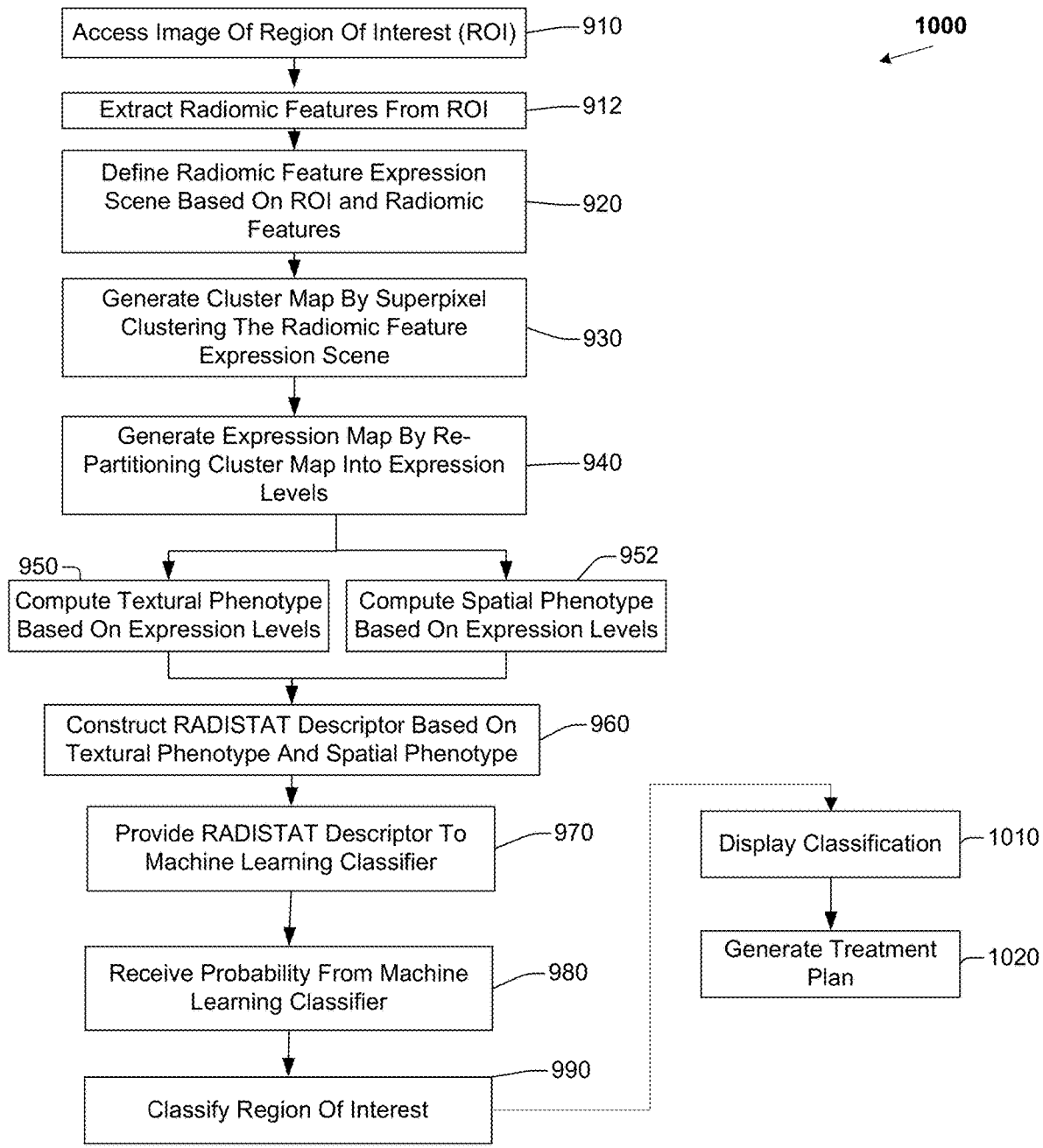
FIG. 10 is a flow diagram of example operations for classifying a region of interest as a responder or non-responder, or as a long-term survivor or short-term survivor.

FIG. 10 illustrates an example set of operations 1000 that is similar to operations 900 but that includes additional details and elements. The set of operations 1000 further includes, at 1010, displaying the classification and at least one of the first probability, the second probability, the RADISTAT descriptor, or the image. The set of operations 1000 further includes, at 1020, generating a personalized cancer treatment plan based, at least in part, on the classification and at least one of the first probability, the second probability, the RADISTAT descriptor, or the image. Generating a personalized cancer treatment plan facilitates delivering a particular treatment that will be therapeutically active to the patient, while minimizing negative or adverse effects experienced by the patient. For example, the cancer treatment plan may suggest a surgical treatment, may define an immunotherapy agent dosage or schedule, or a chemotherapy agent dosage or schedule, for a patient identified as likely to be a long-term survivor, or identified as likely to be a responder. For a patient classified as likely to be a non-responder, or classified as a short-term survivor, other treatments may be suggested.

Figure 11:
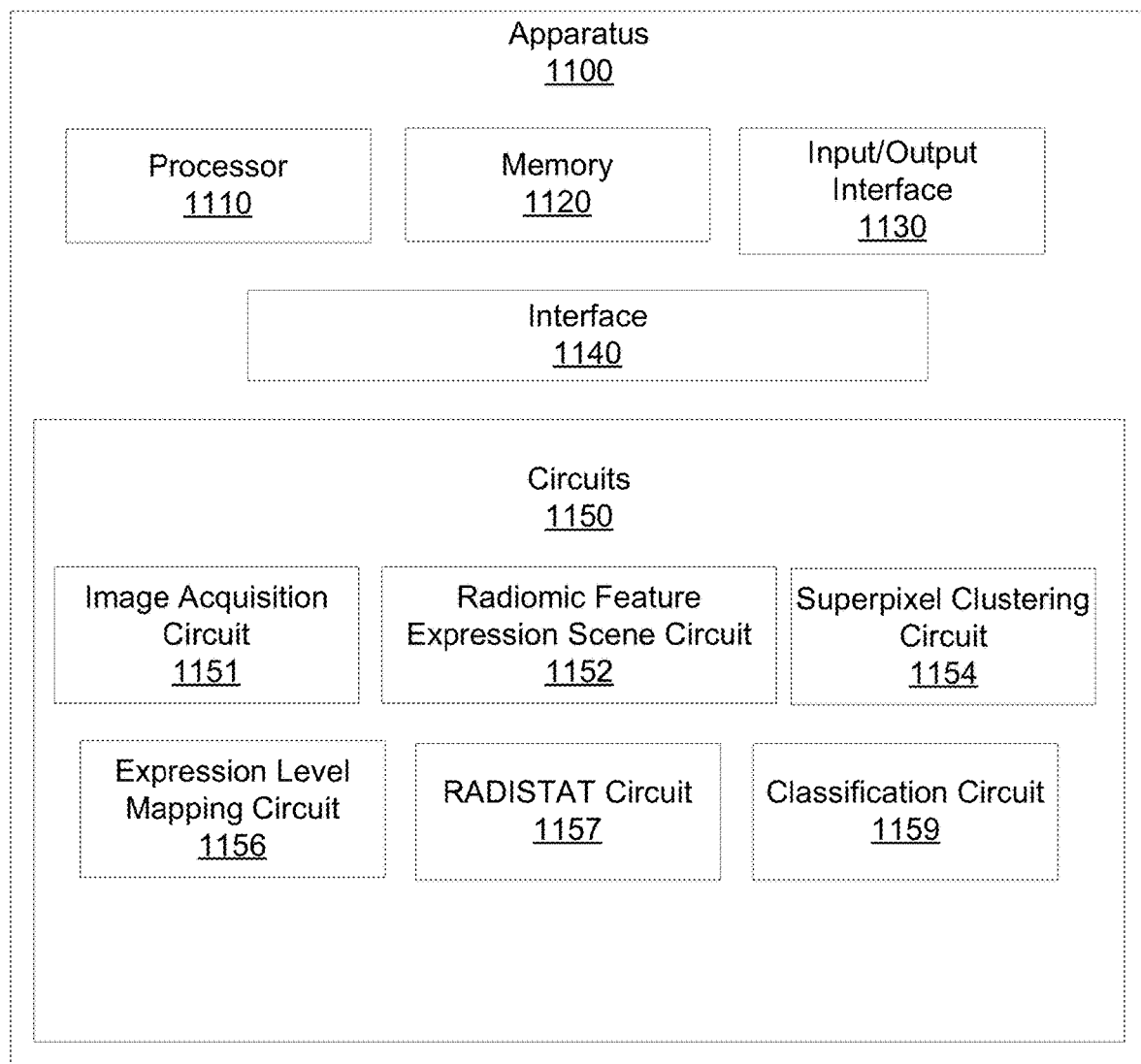
FIG. 11 illustrates an example apparatus for classifying a region of interest as a responder or non-responder, or as a long-term survivor or short-term survivor.

FIG. 11 illustrates an example apparatus 1100 for predicting treatment response or overall survival in cancerous pathology. Apparatus 1100 includes a processor 1110. Apparatus 1100 also includes a memory 1120. Processor 1110 may, in one embodiment, include circuitry such as, but not limited to, one or more single-core or multi-core processors. Processor 1110 may include any combination of general-purpose processors and dedicated processors (e.g., graphics processors, application processors, etc.). The processors may be coupled with or may include memory (e.g. memory 1120) or storage and may be configured to execute instructions stored in the memory or storage to enable various apparatus, applications, or operating systems to perform the operations. Memory 1120 is configured to store a digitized image of a region of tissue demonstrating cancerous pathology.

In one embodiment, memory 1120 is configured to store a set of digitized images of a region of tissue demonstrating cancerous pathology. A member of the set of digitized images includes a plurality of pixels, a pixel having an intensity.

Apparatus 1100 also includes an input/output (I/O) interface 1130. Apparatus 1100 also includes a set of circuits 1150. The set of circuits 1150 includes an image acquisition circuit 1151, a radiomic feature expression scene circuit 1152, a superpixel clustering circuit 1154, an expression level mapping circuit 1156, a RADISTAT circuit 1157, and a classification circuit 1159. Apparatus 1100 further includes an interface 1140 that connects the processor 1110, the memory 1120, the I/O interface 1130, and the set of circuits 1150.

Image acquisition circuit 1151 is configured to access the set of digitized images of the region of tissue demonstrating cancerous pathology. In one embodiment, a member of the set of images may be a 3 Tesla T2-w MRI image of a region of tissue demonstrating RCa, or a GD-C T1-w MRI image of a region of tissue demonstrating GBM. A member of the set of images may be a contrast enhanced MRI image. A member of the set of images includes a target tissue ROI. Accessing the set of images includes acquiring electronic data, reading from a computer file, receiving a computer file, reading from a computer memory (e.g., memory 1120), or other computerized activity. In another embodiment, accessing the image may include accessing a network attached storage (NAS), a cloud storage system, or other type of electronic storage system. Accessing the set of digitized images may, in one embodiment, include accessing a NAS device, a cloud storage system, or other type of electronic storage system using input/output interface 1130.

Radiomic feature expression scene circuit 1152 is configured to extract a set of radiomic features from the ROI. A radiomic feature has a value. In one embodiment, the set of radiomic features includes at least one gray level co-occurrence matrix (GLCM) feature. The at least one GLCM feature may be an entropy feature, an energy feature, an inertia feature, a correlation feature, an information measure 1 feature, an information measure 2 feature, a sum average feature, a sum variance feature, a sum entropy feature, a difference average feature, a difference variance feature, or a difference entropy feature. In another embodiment, the set of radiomic features may include other types of radiomic feature, including, for example, a Gabor feature, a co-occurrence of local anisotropic gradient orientations feature, a Laws feature, or other radiomic feature. In one embodiment, the set of radiomic features is extracted on a pixel-wise basis. The set of radiomic features are sub-visual features that cannot be perceived by the human eye or extracted by pencil and paper. Radiomic feature expression scene circuit 1152 is also configured to define a radiomic feature expression scene based on the ROI and the set of radiomic features. The radiomic feature expression scene includes a spatial grid of pixels, where a pixel in the grid of pixels is associated with a radiomic feature value. In one embodiment, radiomic feature expression scene circuit 1152 is further configured to normalize the radiomic feature expression scene.

Superpixel clustering circuit 1154 is configured to generate a cluster map based on the image and the set of radiomic features. Superpixel clustering circuit 1154 generates the cluster map by superpixel clustering the radiomic feature expression scene. In one embodiment, superpixel clustering circuit 1154 is configured to superpixel cluster the radiomic feature expression scene using a modified simple linear iterative clustering (SLIC) approach to generate K clusters. K is based on a minimum number of pixels in a cluster, and a distance between initial cluster seeds. K is an integer. In one embodiment, superpixel clustering circuit 1154 is further configured to normalize the cluster map such that an average radiomic feature value within a cluster has a minimum of 0 or a maximum of 1.

Expression level mapping circuit 1156 is configured to generate an expression map based on the cluster map. Expression level mapping circuit 1156 generates the expression map by repartitioning the cluster map into B expression levels. B is an integer. In one embodiment, B equals 3. In another embodiment, B may have another, different value (e.g., 4, 5, 7). In one embodiment, B may be user selectable or adjustable. B may be selected or adjusted based, for example, on image size, image resolution, image quality, experimental results, the particular pathology being investigated, computational resources, processing time, or other consideration.

RADISTAT circuit 1157 is configured to compute a textural phenotype for the expression map based on the B expression levels. RADISTAT circuit 1157 is also configured compute a spatial phenotype for the expression map based on the B expression levels. Computing the textural phenotype includes quantifying the fraction of each of B expression levels in the expression map. Computing the spatial phenotype includes quantifying the adjacency for each pairwise combination of B expression levels in the expression map. In one embodiment, computing the textural phenotype includes quantifying the fraction of a threshold number of B expression levels in the expression map. In one embodiment, computing the spatial phenotype includes quantifying the adjacency for a threshold number of pairwise combination of B expression levels in the expression map.

RADISTAT circuit 1157 is also configured to construct the RADISTAT descriptor by concatenating the textural phenotype with the spatial phenotype. In another embodiment, RADISTAT circuit 1157 is configured to construct the RADISTAT descriptor based on a weighted combination of the textural phenotype and the spatial phenotype. In another embodiment, RADISTAT circuit 1157 is configured to construct the RADISTAT descriptor based on a matrix multiplication of the textural phenotype and the spatial phenotype. In another embodiment, the RADISTAT descriptor may use a different combination of phenotypes. RADISTAT circuit 1157 is further configured to compute a first probability that the ROI is a responder or non-responder, based, at least in part, on the RADISTAT descriptor. RADISTAT circuit 1157 is further configured to compute a second probability that the ROI will experience long-term survival or short-term survival, based, at least in part, on the RADISTAT descriptor.

In one embodiment, RADISTAT circuit 1157 includes a machine learning classifier or includes machine learning classifier circuitry configured to compute the first probability or the second probability using an LDA classification approach. In another embodiment, RADISTAT circuit 1157 is configured as another different type of machine learning classifier, including a support vector machine (SVM), a random forest classifier, a quadratic discriminant analysis (QDA) classifier, a convolutional neural network (CNN), or other type of machine learning or deep learning classifier.

Classification circuit 1159 is configured to classify the ROI as a responder or non-responder, or as long-term survivor or short-term survivor based, at least in part, on the first probability or the second probability, respectively. While two classes are described here (e.g., responder/non-responder, or long-term survivor/short-term survivor), other classifications (e.g., responder/unknown/non-responder) may be employed.

Figure 12:
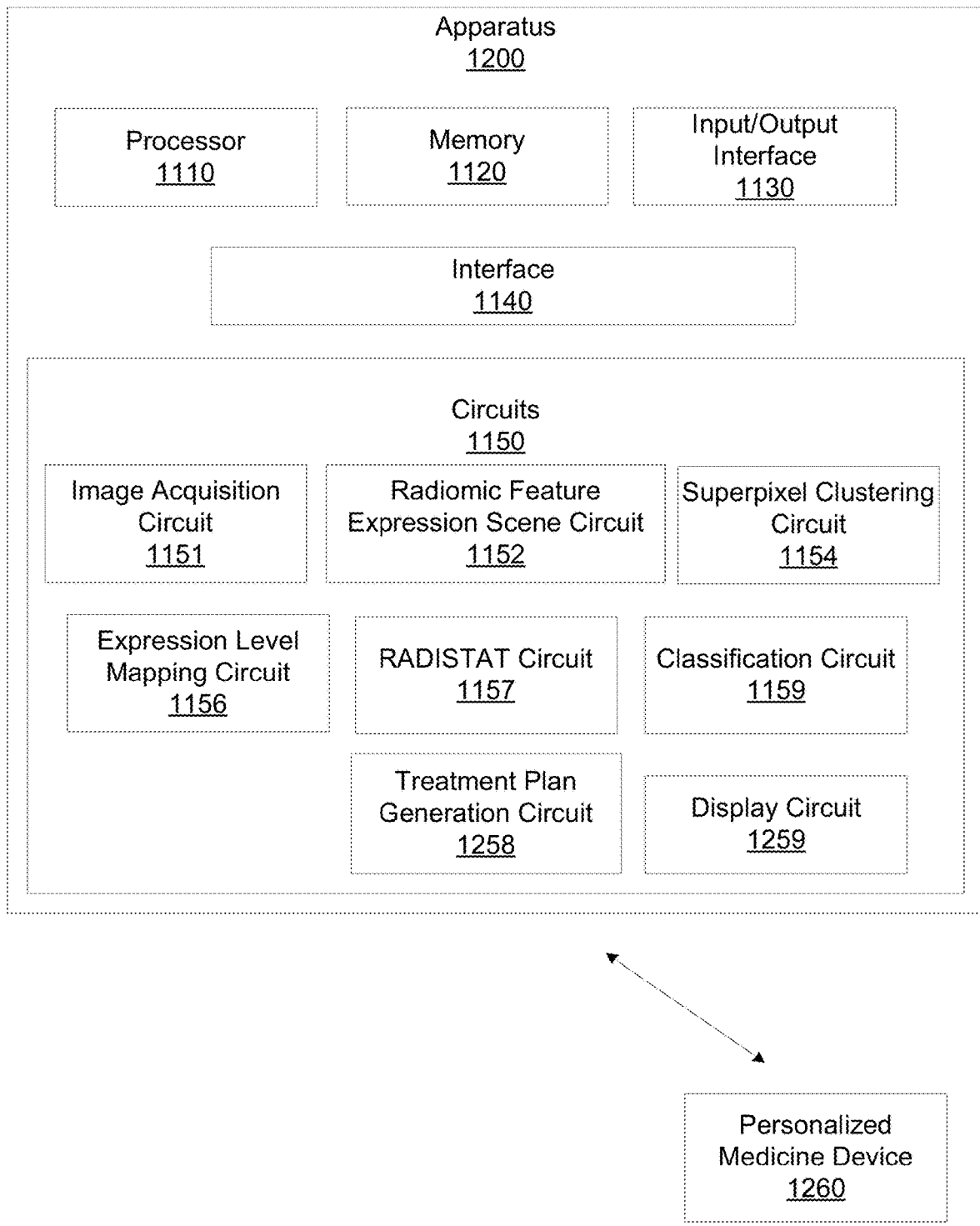
FIG. 12 illustrates an example apparatus for classifying a region of interest as a responder or non-responder, or as a long-term survivor or short-term survivor.

FIG. 12 illustrates an example apparatus 1200 that is similar to apparatus 1100 but that includes additional elements and details. In one embodiment, apparatus 1200 further includes a treatment plan generation circuit 1258 configured to generate a treatment plan based, at least in part, on the classification. In one embodiment, treatment plan generation circuit generates the treatment plan based on the classification and at least one of the RADISTAT descriptor, the image the first probability, or the second probability. In one embodiment, apparatus 1200 further includes a display circuit 1259 configured to display the treatment plan, the image, the RADISTAT descriptor, the first probability, the second probability, or the classification.

Treatment plan generation circuit 1258 is configured to generate a cancer treatment plan for the patient of which the set of digitized images was acquired based, at least in part, the classification, the set of digitized images, the RADISTAT descriptor, the first probability, or the second probability. Defining a personalized cancer treatment plan facilitates delivering a particular treatment that will be therapeutically active to the patient, while minimizing negative or adverse effects experienced by the patient. For example, the cancer treatment plan may suggest a surgical treatment, may define an immunotherapy agent dosage or schedule, or a chemotherapy agent dosage or schedule, for a patient identified as likely to be a long-term survivor, or identified as likely to be a responder. For a patient classified as likely to be a non-responder, or classified as a short-term survivor, other treatments may be suggested.

In another embodiment, apparatus 1100 or apparatus 1200 may control a CADx system to classify the region of tissue represented in the image, at least in part, on the first probability or the second probability. In other embodiments, other types of CADx systems may be controlled, including CADx systems for predicting treatment response or overall survival time in other tissue presenting other, different pathologies that may be distinguished based on a RADISTAT descriptor generated from features extracted from other types of radiological images. For example, embodiments described herein may be employed to predict treatment response or overall survival time using a machine learning classifier in breast cancer (BCa), kidney disease, lung cancer, or prostate cancer.

Display circuit 1259 is configured to display the treatment plan, the image, the RADISTAT descriptor, the first probability, the second probability, or the classification. In one embodiment, display circuit 1259 is configured to display the treatment plan, the image, the RADISTAT descriptor, the first probability, the second probability, or the classification on a computer monitor, a smartphone display, a tablet display, or other displays. Displaying the treatment plan, the image, the RADISTAT descriptor, the first probability, the second probability, or the classification may also include printing the treatment plan, the image, the RADISTAT descriptor, the first probability, the second probability, or the classification. Display circuit 1259 may also control a CADx system, a monitor, or other display, to display operating parameters or characteristics of image acquisition circuit 1151, radiomic feature expression scene circuit 1152, superpixel clustering circuit 1154, expression level mapping circuit 1156, RADISTAT circuit 1157, or classification circuit 1159, including a machine learning classifier, during both training and testing, or during clinical operation of apparatus 1100 or apparatus 1200.

In another embodiment of apparatus 1100 or 1200, the set of circuits 1150 further includes a training circuit configured to train RADISTAT circuit 1157. Training RADISTAT circuit 1157 may include training a machine learning classifier. In one embodiment, the training circuit is configured to access a dataset of digitized images of a region of interest demonstrating RCa or GBM. In this embodiment, the machine learning classifier is trained and tested using a training set of images and a testing set of images. Training the machine learning classifier may include training the machine learning classifier until a threshold level of accuracy is achieved, until a threshold time has been spent training the machine learning classifier, until a threshold amount of computational resources have been expended training the machine learning classifier, or until a user terminates training. Other training termination conditions may be employed.

FIG. 12 also illustrates a personalized medicine device 1260. Personalized medicine device 1260 may be, for example, a CADx system, a RCa or GBM overall survival time prediction system, a RCa or GBM treatment response prediction system, or other type of personalized medicine device that may be used to facilitate the prediction of treatment response or survival time. In one embodiment, treatment plan generation circuit 1258 may control personalized medicine device 1260 to display the treatment plan, the image, the RADISTAT descriptor, the first probability, the second probability, or the classification on a computer monitor, a smartphone display, a tablet display, or other displays.

Embodiments described herein, including at least apparatus 1100 and 1200, resolve features extracted from the set of digitized images at a higher order or higher level than a human can resolve in the human mind or with pencil and paper. For example, the GLCM features are not biological properties of cancerous tissue that a human eye can perceive. A tumor does not include a GLCM, and these features cannot be stored in a human mind. The RADISTAT descriptor provided to the machine learning classifier is of a different nature than the tumor represented in the image, or the GLCM features. The probabilities computed by RADISTAT circuit 1157 are of a fundamentally different nature than the set of digitized images, or of the tissue from which the images were generated.

Displaying the treatment plan, the image, the RADISTAT descriptor, the first probability, the second probability, or the classification involves but is not limited to extracting and changing the character of information present in a region of tissue (e.g. biological tissue), to a radiological image (e.g. MRI image), to changing the information present in the image to information of a different character in the set of radiomics features, the probability, and the treatment plan. Embodiments described herein further transform the character of information to information suitable for display on, for example, a computer monitor, a smartphone display, a tablet display, or other displays. Thus, embodiments described herein use a combined order of specific rules, elements, or components that render information into a specific format that is then used and applied to create desired results more accurately, more consistently, and with greater reliability than existing approaches.

Figure 14:
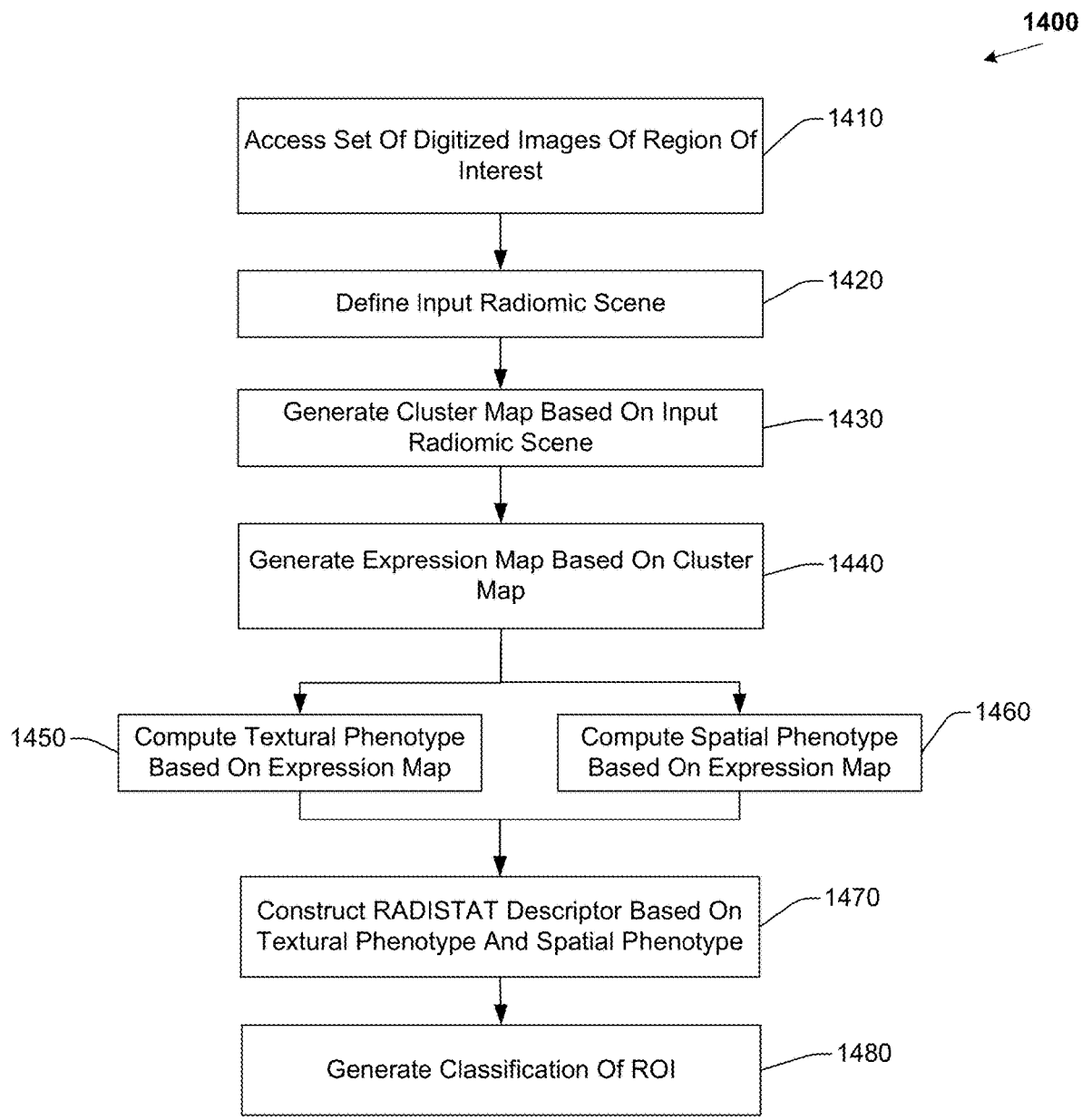
FIG. 14 illustrates an example method for classifying a region of interest as a responder or non-responder, or as a long-term survivor or short-term survivor.

FIG. 14 illustrates a computerized method 1400 for characterizing intra-tumoral heterogeneity for treatment response and outcome prediction in cancerous pathology. Method 1400 may, in one embodiment, be implemented by apparatus 1100 or apparatus 1200, or computer 1300. Method 1400 includes, at 1410 accessing a set of digitized images of a region of tissue demonstrating cancerous pathology. In one embodiment, a member of the set of digitized images may be a 2T-w MRI image of a region of tissue demonstrating RCa, a GD-C T1-w MRI image of a region of tissue demonstrating GBM, a contrast enhanced MRI image of a region of tissue demonstrating cancerous pathology, or a radiological image of a region of tissue demonstrating other, cancerous pathology. Accessing the set of images includes acquiring electronic data, reading from a computer file, receiving a computer file, reading from a computer memory, or other computerized activity. A member of the set of images has a plurality of pixels, a pixel having an intensity.

Method 1400 also includes, at 1420 defining an input radiomic scene I based on a member of the set of images. The input radiomic scene I may include a spatial grid of pixels, where a pixel is associated with a radiomic feature value. Defining the input radiomic scene I may further include normalizing the range of the input radiomic scene I.

Method 1400 also includes, at 1430, generating a cluster map $\hat{I}$. The cluster map $\hat{I}$ is generated by applying superpixel clustering to the input radiomic scene I. In one embodiment, a modified SLIC approach is employed to generate clusters. In one embodiment, generating the cluster map $\hat{I}$ may further include normalizing cluster map $\hat{I}$.

Method 1400 also includes, at 1440, generating an expression map $\tilde{I}$ by repartitioning cluster map $\hat{I}$ into B expression levels. B is an integer. In one embodiment where B=3, a first expression level indicates low (L) feature expression, a second expression level indicates medium (M) expression, and a third expression level indicates high (H) feature expression. In another embodiment, B may have another different value (e.g., B=4, B=5), and expression map $\tilde{I}$ may be generated by repartitioning cluster map $\hat{I}$ into the other, different number of expression levels.

Method 1400 also includes, at 1450, computing a textural phenotype. The textural phenotype is computed as the proportion of each of the B expression levels in the expression map $\tilde{I}$. Thus, when B=3, the textural phenotype is computed as the proportion of each of the low, medium, and high expression levels in the expression map $\tilde{I}$. The textural phenotype may be expressed as a 1×B feature vector.

Method 1400 also includes, at 1460, computing a spatial phenotype. The spatial phenotype is computed as the number of times L-M, M-H, and L-H expression levels are adjacent to each other, based on adjacency represented in the expression map $\tilde{I}$. The spatial phenotype may be expressed as a 1×N feature vector, where $$N = \binom{B}{2}$$

is the total number of expression level pairs in the expression map.

Method 1400 also includes, at 1470, generating a RADISTAT descriptor by concatenating the textural phenotype with the spatial phenotype. In one embodiment, the RADISTAT descriptor characterizes the spatial diversity of feature overexpression and feature under-expression exhibited in the expression map.

Method 1400 further includes, at 1480, generating a classification of the region of tissue as a responder or non-responder, or as a long-term survivor or short-term survivor based, at least in part, on the RADISTAT descriptor. In one embodiment, method 1400 further includes displaying the classification or the RADISTAT descriptor on a computer monitor, smartphone display, or other type of electronic display device.

Improved identification or classification of patients who will respond or not respond to treatment, or who will be long-term survivors or short term survivors may produce the technical effect of improving treatment efficacy by increasing the accuracy of and decreasing the time required to treat patients demonstrating RCa or GBM, or other forms of cancerous pathology. Treatments and resources, including expensive immunotherapy agents or chemotherapy may be more accurately tailored to patients with a likelihood of benefiting from said treatments and resources, including responding to immunotherapy or chemotherapy, so that more appropriate treatment protocols may be employed, and expensive resources are not wasted. Controlling a personalized medicine system, a CADx system, a processor, or a RCa or GBM response or survival time prediction system based on improved, more accurate identification or classification of patients who will experience RCa or GBM further improves the operation of the system, processor, or apparatus, since the accuracy of the system, processor, or apparatus is increased and unnecessary operations will not be performed.

Using a more appropriately modulated treatment may lead to less aggressive therapeutics being required for a patient or may lead to avoiding or delaying a biopsy, a resection, or other invasive procedure. When patients experiencing RCa or GBM who will more likely experience treatment response or long-term survival are more quickly and more accurately distinguished from patients who will not, patients most at risk may receive a higher proportion of scarce resources (e.g., therapeutics, physician time and attention, hospital beds) while those less likely to benefit from the treatment may be spared unnecessary treatment, which in turn spares unnecessary expenditures and resource consumption. Example methods, apparatus, and other embodiments may thus have the additional effect of improving patient outcomes compared to existing approaches.

While FIGS. 4, 9-10, and 14 illustrate various actions occurring in serial, it is to be appreciated that various actions illustrated in FIGS. 4, 9-10, and 14 could occur substantially in parallel. By way of illustration, a first process could involve computing a textural phenotype, a second process could involve computing a spatial phenotype, and a third process could involve classifying a region of interest. While three processes are described, it is to be appreciated that a greater or lesser number of processes could be employed and that lightweight processes, regular processes, threads, and other approaches could be employed.

In one example, a method may be implemented as computer executable instructions. Thus, in one example, a computer-readable storage device may store computer executable instructions that if executed by a machine (e.g., computer, processor) cause the machine to perform methods or operations described or claimed herein including methods or operations 900, 1000, or 1400. While executable instructions associated with the listed methods are described as being stored on a computer-readable storage device, it is to be appreciated that executable instructions associated with other example methods described or claimed herein may also be stored on a computer-readable storage device. In different embodiments the example methods described herein may be triggered in different ways. In one embodiment, a method may be triggered manually by a user. In another example, a method may be triggered automatically.

Figure 13:
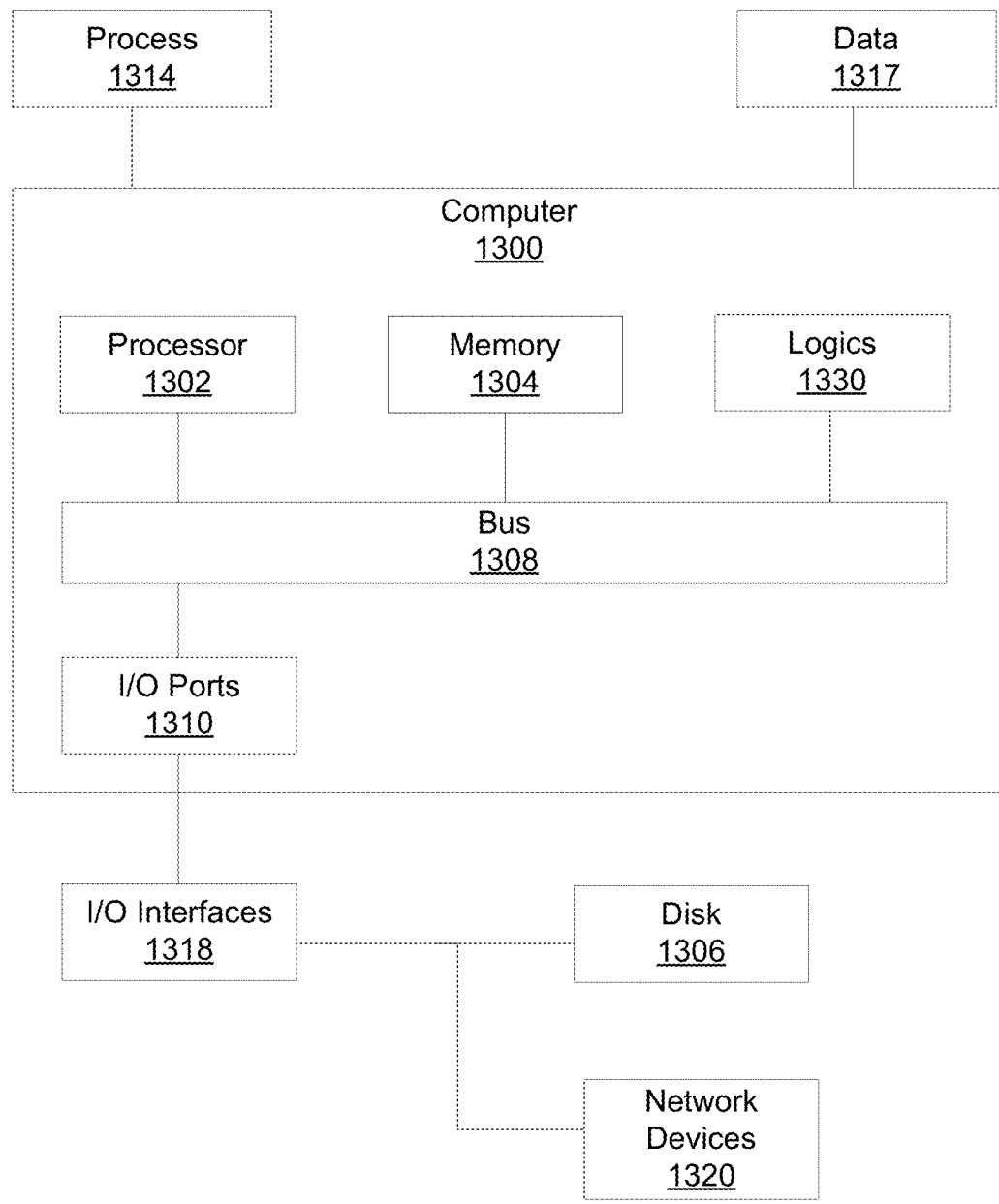
FIG. 13 illustrates an example computer in which example embodiments described herein may operate.

FIG. 13 illustrates an example computer 1300 in which example methods or operations illustrated herein can operate and in which example methods, apparatus, circuits, operations, or logics may be implemented. In different examples, computer 1300 may be part of a personalized medicine system, an RCa or GBM treatment response or survival time prediction system, an MRI system, a digital whole slide scanner, a CT system, may be operably connectable to a CT system, an MRI system, a personalized medicine system, or a digital whole slide scanner, or may be part of a CADx system.

Computer 1300 includes a processor 1302, a memory 1304, and input/output (I/O) ports 1310 operably connected by a bus 1308. In one example, computer 1300 may include a set of logics or circuits 1330 that perform a method of predicting treatment response or survival time using a machine learning classifier. Thus, the set of circuits 1330, whether implemented in computer 1300 as hardware, firmware, software, and/or a combination thereof may provide means (e.g., hardware, firmware, circuits) for characterizing intra-tumoral heterogeneity, or predicting treatment response or survival time of cancer patients, including RCa or GBM patients. In different examples, the set of circuits 1330 may be permanently and/or removably attached to computer 1300.

Processor 1302 can be a variety of various processors including dual microprocessor and other multi-processor architectures. Processor 1302 may be configured to perform steps of methods claimed and described herein. Memory 1304 can include volatile memory and/or non-volatile memory. A disk 1306 may be operably connected to computer 1300 via, for example, an input/output interface (e.g., card, device) 1318 and an input/output port 1310. Disk 1306 may include, but is not limited to, devices like a magnetic disk drive, a tape drive, a Zip drive, a flash memory card, or a memory stick. Furthermore, disk 1306 may include optical drives like a CD-ROM or a digital video ROM drive (DVD ROM). Memory 1304 can store processes 1314 or data 1317, for example. Data 1317 may, in one embodiment, include digitized MRI images of a region of tissue demonstrating RCa or GBM. Disk 1306 or memory 1304 can store an operating system that controls and allocates resources of computer 1300.

Bus 1308 can be a single internal bus interconnect architecture or other bus or mesh architectures. While a single bus is illustrated, it is to be appreciated that computer 1300 may communicate with various devices, circuits, logics, and peripherals using other buses that are not illustrated (e.g., PCIE, SATA, Infiniband, 1394, USB, Ethernet).

Computer 1300 may interact with input/output devices via I/O interfaces 1318 and input/output ports 1310. Input/output devices can include, but are not limited to, CT systems, MRI systems, digital whole slide scanners, an optical microscope, a keyboard, a microphone, a pointing and selection device, cameras, video cards, displays, disk 1306, network devices 1320, or other devices. Input/output ports 1310 can include but are not limited to, serial ports, parallel ports, or USB ports.

Computer 1300 may operate in a network environment and thus may be connected to network devices 1320 via I/O interfaces 1318 or I/O ports 1310. Through the network devices 1320, computer 1300 may interact with a network. Through the network, computer 1300 may be logically connected to remote computers. The networks with which computer 1300 may interact include, but are not limited to, a local area network (LAN), a wide area network (WAN), or other networks, including the cloud.

Examples herein can include subject matter such as an apparatus, a personalized medicine system, a CADx system, a processor, a system, a method, means for performing acts, steps, or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system for predicting cancer treatment response or survival time, according to embodiments and examples described.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage device", as used herein, refers to a device that stores instructions or data. "Computer-readable storage device" does not refer to propagated signals. A computer-readable storage device may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage device may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

"Circuit", as used herein, includes but is not limited to hardware, firmware, software in execution on a machine, or combinations of each to perform a function(s) or an action(s), or to cause a function or action from another logic, method, or system. A circuit may include a software controlled microprocessor, a discrete logic (e.g., ASIC), an analog circuit, a digital circuit, a programmed logic device, a memory device containing instructions, and other physical devices. A circuit may include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical circuit between multiple physical circuits.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A non-transitory computer-readable storage device storing computer executable instructions that when executed control a processor to perform operations, the operations including:
    accessing an image of a region of interest (ROI) demonstrating cancerous pathology, the image having a pixel, a pixel having an intensity;
    extracting a set of radiomic features from the ROI, a radiomic feature having a value;
    defining a radiomic feature expression scene based on the ROI and the set of radiomic features;
    generating a cluster map by superpixel clustering the radiomic feature expression scene;
    generating an expression map by repartitioning the cluster map into B expression levels, where B is an integer;
    computing a textural phenotype for the expression map based on the B expression levels;
    computing a spatial phenotype for the expression map based on the B expression levels;
    constructing a radiomic spatial textural (RADISTAT) descriptor by concatenating the textural phenotype with the spatial phenotype;
    providing the RADISTAT descriptor to a machine learning classifier;
    receiving, from the machine learning classifier, a first probability that the ROI is a responder or non-responder, or a second probability that the ROI will experience long-term survival or short-term survival, where the machine learning classifier computes the first probability or the second probability based, at least in part, on the RADISTAT descriptor; and
    generating a classification of the ROI as a responder or non-responder, or as a long-term survivor or short-term survivor based on the first probability or the second probability, respectively.

2. The non-transitory computer-readable storage device of claim 1, where the set of radiomic features includes at least one gray level co-occurrence matrix (GLCM) feature, where the at least one GLCM feature is an entropy feature, an energy feature, an inertia feature, a correlation feature, an information measure 1 feature, an information measure 2 feature, a sum average feature, a sum variance feature, a sum entropy feature, a difference average feature, a difference variance feature, or a difference entropy feature, or where the set of radiomic features includes a Gabor feature, a co-occurrence of local anisotropic gradient tensors feature, or a Laws feature.

3. The non-transitory computer-readable storage device of claim 2, where the set of radiomic features is extracted on a pixel-wise basis.

4. The non-transitory computer-readable storage device of claim 1, where the radiomic feature expression scene includes a spatial grid of pixels, where a pixel in the grid of pixels is associated with a radiomic feature value.

5. The non-transitory computer-readable storage device of claim 4, where the range of radiomic feature expression scene is normalized to lie between 0 and 1.

6. The non-transitory computer-readable storage device of claim 1, where generating the cluster map by superpixel clustering the radiomic feature expression scene includes using a modified simple linear iterative clustering (SLIC) approach to generate K clusters, where K is based on a minimum number of pixels in a cluster, and a distance between initial cluster seeds, where K is an integer.

7. The non-transitory computer-readable storage device of claim 6, where the cluster map is normalized such that an average radiomic feature value within a cluster has a minimum of 0 or a maximum of 1.

8. The non-transitory computer-readable storage device of claim 6, where B equals 3, the minimum number of pixels in a cluster is 7, and the distance between initial cluster seeds is 5 pixels.

9. The non-transitory computer-readable storage device of claim 1, where computing the textural phenotype includes quantifying the fraction of each of B expression levels in the expression map.

10. The non-transitory computer-readable storage device of claim 1, where computing the spatial phenotype includes quantifying the adjacency for each pairwise combination of B expression levels in the expression map.

11. The non-transitory computer-readable storage device of claim 1, the operations further comprising displaying the classification and at least one of the first probability, the second probability, the RADISTAT descriptor, or the image.

12. The non-transitory computer-readable storage device of claim 1, the operations further comprising generating a personalized cancer treatment plan based, at least in part, on the classification and at least one of the first probability, the second probability, the RADISTAT descriptor, or the image.

13. The non-transitory computer-readable storage device of claim 1, where the image is a 3 Tesla T2-w magnetic resonance imaging (MRI) image of a region of tissue demonstrating rectal cancer (RCa), a gadolinium-contrast (GD-C) T1-w MRI image of a region of tissue demonstrating Glioblastoma multiforme (GBM), a contrast enhanced MRI image of a region of tissue demonstrating cancerous pathology, or a diffusion-weighted MRI image of a region of tissue demonstrating cancerous pathology.

14. An apparatus for predicting treatment response or survival time in cancerous pathology, the apparatus comprising:
a processor;
a memory configured to store a set of digitized images of a region of interest (ROI) demonstrating cancerous pathology, where a member of the set of digitized images has a plurality of pixels, a pixel having an intensity;
an input/output (I/O) interface;
a set of circuits comprising an image acquisition circuit, a radiomic feature expression scene circuit, a superpixel clustering circuit, an expression level mapping circuit, a radiomic spatial textural descriptor (RADISTAT) circuit, and a classification circuit; and
an interface that connects the processor, the memory, the I/O interface, and the set of circuits;
the image acquisition circuit configured to access a member of the set of digitized images of the ROI demonstrating cancerous pathology;
the radiomic feature expression scene circuit configured:
extract a set of radiomic features from the ROI, a radiomic feature having a value; and
define a radiomic feature expression scene based on the ROI and the set of radiomic features;
the superpixel clustering circuit configured to generate a cluster map by superpixel clustering the radiomic feature expression scene;
the expression level mapping circuit configured to generate an expression map by repartitioning the cluster map into B expression levels, where B is an integer;
the RADISTAT circuit configured to:
compute a textural phenotype for the expression map based on the B expression levels;
compute a spatial phenotype for the expression map based on the B expression levels;
construct a RADISTAT descriptor by concatenating the textural phenotype with the spatial phenotype; and
compute a first probability that the ROI is a responder or non-responder, or a second probability that the ROI will experience long-term survival or short-term survival, based, at least in part, on the RADISTAT descriptor; and
the classification circuit configured to generate a classification of the ROI as a responder or non-responder, or as long-term survivor or short-term survivor based, at least in part, on the first probability or the second probability, respectively.

15. The apparatus of claim 14, where the radiomic feature expression scene includes a spatial grid of pixels, where a pixel in the grid of pixels is associated with a radiomic feature value.

16. The apparatus of claim 14, where the superpixel clustering circuit is configured to generate the cluster map by superpixel clustering the radiomic feature expression scene using a modified simple linear iterative clustering (SLIC) approach to generate K clusters, where K is based on a minimum number of pixels in a cluster, and a distance between initial cluster seeds, where K is an integer, and where the superpixel clustering circuit is configured to normalize the cluster map such that an average radiomic feature value within a cluster has a minimum of 0 or a maximum of 1.

17. The apparatus of claim 14, where B=3.

18. The apparatus of claim 14, where the RADISTAT circuit is configured to:
compute the textural phenotype for the expression map based on the B expression levels by quantifying the fraction of each of B expression levels in the expression map; and
compute the spatial phenotype for the expression map based on the B expression levels by quantifying the adjacency for each pairwise combination of B expression levels in the expression map.

19. The apparatus of claim 15, the set of circuits further comprising a:
display circuit configured to display the classification, the first probability, the second probability, the RADISTAT descriptor, the ROI, or the member of the set of digitized images; and
a cancer treatment plan circuit configured to generate a personalized cancer treatment plan based, at least in part, on the classification and at least one of the first probability, the second probability, the RADISTAT descriptor, or the member of the set of digitized images.

20. A non-transitory computer-readable storage device storing computer-executable instructions that when executed by a computer control the computer to perform a method comprising:

accessing a set of digitized images of a region of tissue demonstrating cancerous pathology, where a member of the set of digitized images has a plurality of pixels, a pixel having an intensity;

defining an input radiomic scene I based on a member of the set of digitized images, where the input radiomic scene I includes a spatial grid of pixels, where a pixel is associated with a radiomic feature value;

generating a cluster map $\hat{I}$ by applying superpixel clustering to the input radiomic scene I;

generating an expression map $\tilde{I}$ by repartitioning cluster map $\hat{I}$ into B expression levels, where B is an integer;

computing a textural phenotype based on the proportion of each of B expression levels in the expression map $\tilde{I}$;

computing a spatial phenotype based on the adjacency of the B expression levels represented in the expression map $\tilde{I}$;

generating a RADISTAT descriptor by concatenating the textural phenotype with the spatial phenotype; and generating a classification of the region of tissue as a responder or non-responder, or as a long-term survivor or short-term survivor based, at least in part, on the RADISTAT descriptor.

* * * * *